United States Patent [19]
Ohta et al.

[11] Patent Number: 5,952,150
[45] Date of Patent: Sep. 14, 1999

[54] RADIATION SENSITIVE RESIN COMPOSITION

[75] Inventors: Yoshihisa Ohta; Yong Wang; Takayoshi Tanabe; Shin-ichiro Iwanaga, all of Yokkaichi, Japan

[73] Assignee: JSR Corporation, Tokyo, Japan

[21] Appl. No.: 08/892,200

[22] Filed: Jul. 14, 1997

[30] Foreign Application Priority Data

Jul. 18, 1996 [JP] Japan .................................. 8-206360
Apr. 9, 1997 [JP] Japan .................................. 9-105403

[51] Int. Cl.$^6$ .................................................. G03C 1/492
[52] U.S. Cl. ...................... 430/270.1; 430/325; 430/326; 430/921; 430/927
[58] Field of Search .................... 430/270.1, 326, 430/921, 927, 325

[56] References Cited

U.S. PATENT DOCUMENTS

| 5,332,650 | 7/1994 | Murata et al. | 430/270 |
| 5,348,838 | 9/1994 | Ushirogouchi et al. | 430/270 |
| 5,372,914 | 12/1994 | Naito et al. | 430/296 |
| 5,525,453 | 6/1996 | Przybilla et al. | 430/170 |

FOREIGN PATENT DOCUMENTS

| 0 634 696 | 1/1995 | European Pat. Off. . |
| 0 660 187 | 6/1995 | European Pat. Off. . |
| 0 718 316 | 6/1996 | European Pat. Off. . |

OTHER PUBLICATIONS

Yu, J. et al., Tetrahedron Lett., 35(30), pp. 5437–5440, 1994.

*Primary Examiner*—Janet Baxter
*Assistant Examiner*—Rosemary Ashton
*Attorney, Agent, or Firm*—Oblon, Spivak, McClelland, Maier & Neustadt, P.C.

[57] ABSTRACT

A positive-tone or negative-tone radiation sensitive resin composition which allows easy preparation of a resist, exhibits superior storage stability, high sensitivity, and high resolution capability, and is capable of producing excellent resist patterns. The positive-tone type composition comprises (A) a disulfonylmethane derivative in which the main chain with two sulfonyl groups bonded forms a three to eleven member cyclic carbon structure and (B) (a) a resin protected by an acid decomposable group or (b) an alkali-soluble resin and an alkali-solubility control agent. The negative-tone type composition comprises the component (A), (C) an alkali-soluble resin, and (D) a cross-linking agent.

30 Claims, No Drawings

RADIATION SENSITIVE RESIN COMPOSITION

BACKGROUND OF THE INVENTION

1. Field of the Invention

The present invention relates to a radiation sensitive resin composition and, more particularly, to a positive-tone or negative-tone radiation sensitive resin composition which allows easy preparation of a resist, exhibits superior storage stability, high sensitivity, and high resolution capability, and is capable of producing excellent resist patterns.

2. Description of the Background Art

There is an increasing demand for miniaturization, requiring reduced processing sizes in lithography, in fields requiring fine work such as manufacture of integrated circuits (ICs) in order to achieve high integrity in ICs. Technologies capable of fine processing, even of a size of 0.5 μm or smaller, in a stable manner have become necessary in recent years. Because of this, resists used in such a technology must be capable of forming patterns smaller than 0.5 μm at high precision. It is extremely difficult to produce a minute pattern smaller than 0.5 μm at a high precision by conventional methods using visible light (wavelength 800–400 nm) or near ultraviolet light (wavelength 400–300 nm). Because of this, the use of short wavelength radiation (wavelength 300 nm or less) has been studied.

Given as examples of such a short wavelength radiation are deep ultraviolet rays, such as a bright line spectrum of a mercury lamp (wavelength 254 nm), a KrF excimer laser (wavelength 248 nm), and an ArF excimer laser (wavelength 193 nm); X-rays such as synchrotron radiation; and charged particle rays such as an electron beam. Of these, lithography using an excimer laser is attracting a great attention due to its high output and high efficiency. For this reason, the resists used in lithography also must produce minute patterns of 0.5 μm or less with high sensitivity and high resolution by excimer laser with good reproducibility.

Chemically amplified resists using a radiation sensitive acid generator which generates an acid by being exposed to radiation (hereinafter referred to as "exposure") and in which the sensitivity of resist is increased by the catalytic action of the acid has been proposed as a resist applicable for use with deep ultraviolet light such as from an excimer laser.

As examples of such chemically amplified resists, a combination of a resin protected by a t-butyl group or t-butoxy carbonyl group and a photoacid generator is disclosed in Japanese Patent Application Laid-open No. 45439/1984. Japanese Patent Application Laid-open No. 52845/1985 discloses a combination of a resin protected by a silyl group and a photoacid generator. Beside these, there are many reports relating to chemically amplified resists such as, for example, a resist which contains a resin having an acetal group and a photoacid generator (Japanese Patent Application Laid-open No. 25850/1990).

In these chemically amplified resists, an onium salt such as, for example, triphenylsulfonium trifluoromethanesulfonate is used as the photoacid generator. However, onium salts require careful quality control in the preparation of resists because the onium salts are scarcely soluble in the solvents used for the resists. Other compounds such as a sulfonic acid ester of 2,6-dinitrobenzyl and tris (methanesulfonyloxy) benzene, and bis(cyclohexylsulfonyl) diazomethane are not suitable as the photosensitive component for a chemically amplified resist due to their poor sensitivity.

Accordingly, development of a photoacid generator capable of providing superior resist performance, such as high resolution and highly sensitivity, and exhibiting high solution capability in the solvents used with the resists is strongly desired.

In view of these problems in conventional technologies, an object of the present invention is to provide a positive-tone or negative-tone radiation sensitive resin composition allowing easy preparation of a resist, exhibiting superior storage stability, high sensitivity, and high resolution capability, and capable of producing excellent resist patterns, by selecting a photoacid generator which is highly sensitive to light, especially to deep ultraviolet rays, generating an acid at a high efficiency by being exposed to low level radiation and is abundantly soluble in solvents used with the resist.

SUMMARY OF THE INVENTION

This object can be achieved in the present invention by a positive-tone radiation sensitive resin composition comprising:

(A) a disulfonylmethane derivative of the following formula (1),

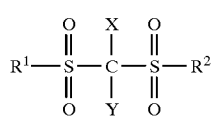

(1)

wherein $R^1$ and $R^2$ may be the same or different and each individually represents a mono-valent acyclic hydrocarbon group, cycloalkyl group, aryl group, aralkyl group, or other mono-valent organic group having a hetero atom; and X and Y may be the same or different and each individually represents an aryl group, hydrogen atom, mono-valent acyclic hydrocarbon group, or other mono-valent organic group having a hetero atom, provided that at least one of X and Y is an aryl group, X and Y in combination form a mono-cyclic or poly-cyclic structure containing one unsaturated bond, or X and Y in combination form the group represented by the following formula (2),

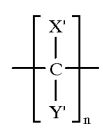

(2)

wherein X' and Y' may be the same or different and each individually represents a hydrogen atom, halogen atom, alkyl group having 1–10 carbon atoms, cycloalkyl group having 3–10 carbon atoms, aryl group having 6–20 carbon atoms, or aralkyl group having 7–20 carbon atoms, or X' and Y' bonded to the same carbon atom or different carbon atoms in combination form a cyclic structure with 3–10 carbon atoms, and n is an integer from 2–10; and (B) (a) a resin protected by an acid decomposable group and insoluble or scarcely soluble in alkali, the resin becoming alkali soluble when the acid decomposable group is decomposed or, (b) an alkali-soluble resin and an alkali-solubility control agent (hereinafter called a first invention).

The above object can also be achieved in the present invention by a negative-tone radiation sensitive resin composition comprising:

(A) a disulfonylmethane derivative of the following formula (1),

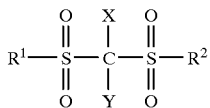

(1)

wherein $R^1$ and $R^2$ may be the same or different and each individually represents a mono-valent acyclic hydrocarbon group, cycloalkyl group, aryl group, aralkyl group, or other mono-valent organic group having a hetero atom; and X and Y may be the same or different and each individually represents an aryl group, hydrogen atom, mono-valent acyclic hydrocarbon group, or other mono-valent organic group having a hetero atom, provided that at least one of X and Y is an aryl group, X and Y in combination form a mono-cyclic or poly-cyclic structure containing one unsaturated bond, or X and Y in combination form the group represented by the following formula (2),

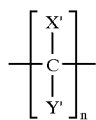

(2)

wherein X' and Y' may be the same or different and each individually represents a hydrogen atom, halogen atom, alkyl group having 1–10 carbon atoms, cycloalkyl group having 3–10 carbon atoms, aryl group having 6–20 carbon atoms, or aralkyl group having 7–20 carbon atoms, or X' and Y' bonded to the same carbon atom or different carbon atoms in combination form a cyclic structure with 3–10 carbon atoms, and n is an integer from 2–10;

(C) an alkali-soluble resin; and (D) a compound capable of cross-linking the alkali-soluble resin in the presence of an acid (hereinafter called a second invention).

Other and further objects, features and advantages of the present invention will appear more fully from the following description.

DETAIL DESCRIPTION OF THE INVENTION AND PREFERRED EMBODIMENTS

Disulfonylmethane Derivatives (A)

The radiation sensitive resin composition of the first invention and the second invention comprises a specific disulfonylmethane derivative shown by the formula (1) as a photoacid generator which changes chemically by exposure to light and produces an acid (hereinafter referred as "acid generator (A)").

A disulfonyl compound is generally known to produce a sulfinic acid by exposure to light. This reaction is caused by breakage of a bond between a main chain carbon atom and a sulfur atom (see, for example, M. Tsunooka, S. Tanaka, M. Tanaka, Makromol. Chem. Rapid Commun., 4, 539–541 (1983) and D. Ruhlmann, J. P., Fouassier, Eur Polym. J., 29, 1079–1088 (1993)).

The present inventors have undertaken extensive studies relating to this reaction of disulfonyl compound and found that if a group bonded to a main chain carbon atom of a disulfonylmethane derivative possesses an aromatic group, forms a monocyclic or polycyclic structure having at least one unsaturated bond together with the main chain carbon atom, or forms the cyclic structure shown by the foregoing formula (2), the internal energy of the fragment which possesses this carbon radical is reduced. This decreases the activation energy for the dissociation reaction for producing the carbon radical and ensures generation of an acid at a high sensitivity.

The acid generator (A) will now be explained in detail.

In formula (1), $R^1$ and $R^2$ may be either the same or different and each individually represents a mono-valent acyclic hydrocarbon group, cycloalkyl group, aryl group, aralkyl group, or other mono-valent organic group having a hetero atom. Given as examples of the mono-valent acyclic hydrocarbon group represented by $R^1$ or $R^2$ are alkyl groups having 1–6 carbon atoms, alkenyl groups having 2–6 carbon atoms, and alkadienyl group having 4–6 carbon atoms. These acyclic hydrocarbon groups may have one or more substitution groups.

Given as specific examples of the alkyl groups having 1–6 carbon atoms among the above mono-valent acyclic hydrocarbon groups are a methyl group, ethyl group, n-propyl group, isopropyl group, n-butyl group, sec-butyl group, t-butyl group, n-pentyl group, and n-hexyl group. Examples of the alkenyl groups having 2–6 carbon atoms include $CH_2=CH-$, $CH_2=CHCH_2-$, $CH_2=C(CH_3)-$ $CH_2=CHCH_2CH_2-$, $CH_2=C(CH_3)CH_2-$, $CH_3CH=CHCH_2-$, $CH_2=CH_2CH_2CH_2CH_2$, $CH_2=C(CH_3)CH_2CH_2-$, and $CH_2=CH_2CH_2CH_2CH_2CH_2-$; and examples of alkadienyl groups having 4–6 carbon atoms are $CH_2=CHCH=CH-$, $CH_2=CHCH=CHCH_2-$, $CH_2=C(CH_3)CH=CH-$, $CH_2=CHCH_2CH=CH-$, and $CH_2=CHCH=CHCH_2CH_2-$.

Given as examples of the substituents for the mono-valent acyclic hydrocarbons are halogen atoms (for example, a fluorine atom, chlorine atom, bromine atom, and iodine atom), amino group, dialkylamino group, acetoamino group, acyl group, acyloxo group, alkylthio group, arylthio group, nitro group, cyano group, arylsulfonyl group, and hydroxyl group.

Enumerated as specific examples of the mono-valent acyclic hydrocarbon groups possessing these substituents are fluoromethyl group, difluoromethyl group, trifluoromethyl group, chloromethyl group, dichloromethyl group, trichloromethyl group, 1-fluoroethyl group, 1-fluoropropyl group, 1-fluorobutyl group, 1-chloroethyl group, 1-chloropropyl group, 1-chlorobutyl group, 1-aminoethyl group, 2-aminoethyl groups, 1-dimethylaminoethyl group, 2-dimethylaminoethyl group, 1-acetoaminoethyl group, 2-acetoaminoethyl groups, acetylmethyl group, 1-phenylthioethyl group, 2-phenylthioethyl group, 1-nitroethyl group, 2-nitroethyl group, 1-cyanoethyl group, 2-cyanoethyl group, phenylsulfonylmethyl group, and di(phenylsulfonyl)methyl group.

Of these unsubstituted and substituted mono-valent acyclic hydrocarbon groups, a methyl group, ethyl group, t-butyl group, trifluoromethyl group, trichloromethyl group, 2-dimethylaminoethyl groups, acetylmethyl group, and di(phenylsulfonyl)methyl group are particularly desirable.

As cycloalkyl groups represented by $R^1$ and $R^2$, cycloalkyl groups having 3–8 carbon atoms, such as cyclopentyl group, cyclohexyl group, cycloheptyl group, and a cyclooctyl group can be given. These cycloalkyl groups may have one or more substituents in suitable positions.

As examples of the substituents on the cycloalkyl groups, alkyl groups and the like can be given in addition to the substituent groups mentioned above as the substituents on the mono-valent acyclic hydrocarbon groups.

Given as specific examples of the cycloalkyl group having substituents are a 4-methylcyclohexyl group, 4-fluorocyclohexyl group, 2-chlorocyclohexyl group, 4-chlorocyclohexyl group, 4-bromocyclohexyl group, and 4-nitrocyclohexyl group.

Of these substituted or unsubstituted cycloalkyl groups, a cyclohexyl group, 2-chlorocyclohexyl group, 4-chlorocyclohexyl group, and the like are particularly desirable.

As examples of aryl groups represented by $R^1$ and $R^2$, a phenyl group, biphenylyl group, 1-naphthyl group, 1-anthryl group, 9-anthryl group, 9-phenanthryl group, and the like can be given. These aryl groups may have one or more substituents in suitable positions.

Givens as examples of the substituent on the aryl groups are an alkyl group having 1–6 carbon atoms, such as a methyl group, ethyl group, n-propyl group, isopropyl group, n-butyl group, sec-butyl group, t-butyl group, n-pentyl group, n-hexyl group, or perfluoro alkyl groups originating from these alkyl groups; a halogen atom, such as a fluorine atom, chlorine atom, bromine atom, or iodine atom; alkoxyl groups having 1–6 carbon atoms, such as a methoxy group, ethoxy group, n-propoxy group, iso-propoxy group, n-butoxy group, sec-butoxy group, or t-butoxy group; acyl groups having 2–11 carbon atoms, such as an acetyl group, propionyl group, butyryl group, hexanoyl group, octanoyl group, or benzoyl group; an acyloxy group having 2–11 carbon atoms, such as an acetyloxy group, propionyloxy group, butyryloxy group, hexanoyloxy group, octanoyloxy group, or benzoyloxy group; aralkyl groups having 7–20 carbon atoms, such as a benzyl group, diphenylmethyl group, 2-phenylethyl group, 2-phenylpropyl group, and 3-phenylpropyl group; and a nitro group, cyano group, hydroxyl group, vinyl group, acetoamino group, and butoxy carbonyloxy.

Specific examples of the aryl group having substituents include a 4-methylphenyl group, 4-ethylphenyl group, 4-n-propylphenyl group, 4-isopropylphenyl group, 4-n-butylphenyl group, 4-t-butylphenyl group, 2,4,6-trimethylphenyl group, 2,4,6-triethylphenyl group, 2,4,6-tri-n-propylphenyl group, 2,4,6-tri-isopropylphenyl group, 4-trifluoromethylphenyl group, 4-fluorophenyl group, 4-chlorophenyl group, 4-bromophenyl group, 4-methoxyphenyl group, 4-ethoxyphenyl group, 3,4-dimethoxyphenyl group, 2-benzoylphenyl group, 4-acetyloxyphenyl group, 4-benzylphenyl group, 4-hydroxyphenyl group, 3,5-dimethyl-4-hydroxyphenyl group, 2-nitrophenyl group, 4-nitrophenyl group, 2,4-dinitrophenyl group, and 4-acetoaminophenyl group.

Of these unsubstituted or substituted aryl groups, particularly preferred are a phenyl group, 4-methylphenyl group, 4-t-butylphenyl group, 2,4,6-tri-isopropylphenyl group, 4-fluorophenyl group, 4-chlorophenyl group, 4-bromophenyl group, 4-methoxyphenyl group, 2-nitrophenyl group, and 4-nitrophenyl group.

As examples of the aralkyl groups represented by $R^1$ and $R^2$, aralkyl groups having 7–20 carbon atoms, such as a benzyl group, diphenylmethyl group, 3,5-diphenylbenzyl group, 2-phenylethyl group, 3-phenylpropyl group, 1-naphthylmethyl group, 1-anthranylmethyl group, and 9-anthranyl methyl group can be given. These aralkyl groups may have one or more substituents in suitable positions.

As substituents of the aralkyl groups, the group given as substituents for the aryl group can be given.

Given as specific examples of such aralkyl groups having substituents are a 4-methylbenzyl group, 4-ethylbenzyl group, 4-n-propylbenzyl group, 4-isopropylbenzyl group, 4-n-butylbenzyl group, 4-t-butylbenzyl group, 4-fluorobenzyl group, 4-methoxybenzyl group, 4-acetyloxybenzyl group, 2-nitrobenzyl group, 4-nitrobenzyl group, 2,4-dinitrobenzyl group, 4-cyanobenzyl group, 4-hydroxybenzyl group, and 4-vinylbenzyl group.

A benzyl group, 9-anthranylmethyl group, 4-fluorobenzyl group, 4-methoxybenzyl group, 2-nitrobenzyl group, 4-nitrobenzyl group, and the like are particularly desirable among these unsubstituted or substituted aralkyl groups.

As examples of the other mono-valent organic groups having hetero atoms represented by $R^1$ and $R^2$, are a cyano group, dimethylaminocarbonyl group, 4-bromobenzoyl group, 2-pyridinyl group, 4-pyridinyl group, and the like.

In the above formula (1), X and Y may be the same or different and each individually represents an aryl group, hydrogen atom, mono-valent acyclic hydrocarbon group, or other mono-valent organic group having a hetero atom, provided that (i) at least one of X and Y is an aryl group, (ii) X and Y in combination form a mono-cyclic or poly-cyclic structure containing one unsaturated bond, or (iii) X and Y in combination form the group represented by the following formula (2).

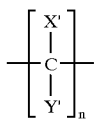

(2)

As examples of aryl groups represented by X or Y, a phenyl group, biphenylyl group, 1-naphthyl group, 1-anthryl group, 9-anthryl group, 9-phenanthryl group, and the like can be given. These aryl groups may have one or more substituents in suitable positions.

Givens as examples of the substituent in the aryl groups are an alkyl group having 1–6 carbon atoms, such as a methyl group, ethyl group, n-propyl group, isopropyl group, n-butyl group, sec-butyl group, t-butyl group, n-pentyl group, n-hexyl group, or perfluoro alkyl groups originating from these alkyl groups; a halogen atom, such as a fluorine atom, chlorine atom, bromine atom, or iodine atom; alkoxyl groups having 1–6 carbon atoms, such as a methoxy group, ethoxy group, n-propoxy group, iso-propoxy group, n-butoxy group, sec-butoxy group, or t-butoxy group; acyl groups having 2–11 carbon atoms, such as an acetyl group, propionyl group, butyryl group, hexanoyl group, octanoyl group, or benzoyl group; acyloxy group having 2–11 carbon atoms, such as an acetyloxy group, propionyloxy group, butyryloxy group, hexanoyloxy group, octanoyloxy group, or benzoyloxy group; aralkyl groups having 7–20 carbon atoms, such as a benzyl group, diphenylmethyl group, 2-phenylethyl group, 2-phenylpropyl group, and 3-phenylpropyl group; and a nitro group, cyano group, hydroxyl group, vinyl group, acetoamino group, and butoxy carbonyloxy.

Specific examples of the aryl group having substituents include a 4-methylphenyl group, 4-ethylphenyl group, 4-n-propylphenyl group, 4-isopropylphenyl group, 4-n-butylphenyl group, 4-sec-butylphenyl group, 4-t-butylphenyl group, 2,4,6-trimethylphenyl group, 2,4,6-triethylphenyl group, 2,4,6-tri-n-propylphenyl group, 2,4,6- tri-isopropylphenyl group, 4-trifluoromethylphenyl group, 4-fluorophenyl group, 4-chlorophenyl group, 4-bromophenyl group, 4-methoxyphenyl group, 4-ethoxyphenyl group, 3,4-dimethoxyphenyl group, 2-benzoylphenyl group, 4-acetyloxyphenyl group, 4-benzylphenyl group, 4-hydroxyphenyl group, 3,5-dimethyl-4-hydroxyphenyl group, 2-nitrophenyl group, 4-nitrophenyl group, 2,4-dinitrophenyl group, and 4-acetoaminophenyl group.

Of these unsubstituted or substituted aryl groups, particularly preferred are a phenyl group, 4-methylphenyl group, 4-t-butylphenyl group, 2,4,6-tri-isopropylphenyl group, 4-fluorophenyl group, 4-chlorophenyl group, 4-bromophenyl group, 4-methoxyphenyl group, 2-nitrophenyl group, and 4-nitrophenyl group.

Given as examples of the mono-valent acyclic hydrocarbon group represented by X or Y are alkyl groups having 1–6 carbon atoms, alkenyl groups having 2–6 carbon atoms, and alkadienyl groups having 4–6 carbon atoms. These acyclic hydrocarbon groups may have one or more substitution groups.

Given as specific examples of the alkyl groups having 1–6 carbon atoms among the above mono-valent acyclic hydrocarbon groups are a methyl group, ethyl group, n-propyl group, isopropyl group, n-butyl group, sec-butyl group, t-butyl group, n-pentyl group, and n-hexyl group. Examples of the alkenyl groups having 2–6 carbon atoms include $CH_2=CH-$, $CH_2=CHCH_2-$, $CH_2=C(CH_3)-$, $CH_2=CHCH_2CH_2-$, $CH_2=C(CH_3)CH_2-$, $CH_3CH=CHCH_2-$, $CH_2=CHCH_2CH_2CH_2-$, $CH_2=C(CH_3)CH_2CH_2-$, and $CH_2=CHCH_2CH_2CH_2CH_2-$; and examples of alkadienyl groups having 4–6 carbon atoms are $CH_2=CHCH=CH-$, $CH_2=CHCH=CHCH_2-$, $CH_2=C(CH_3)CH=CH-$, $CH_2=CHCH_2CH=CH-$, and $CH_2=CHCH=CHCH_2CH_2-$.

Given as examples of the substituents for the mono-valent acyclic hydrocarbons are halogen atoms (for example, a fluorine atom, chlorine atom, bromine atom, and iodine atom), amino group, dialkylamino group, acetoamino group, acyl group, acyloxo group, alkylthio group, arylthio group, nitro group, cyano group, arylsulfonyl group, and hydroxyl group.

Given as specific examples of the mono-velent acyclic hydrocarbon groups possessing these substituents are a fluoromethyl group, difluoromethyl group, trifluoromethyl group, chloromethyl group, dichloromethyl group, trichloromethyl group, bromomethyl group, dibromomethyl group, tribromomethyl group, 1-fluoroethyl group, 1-fluoropropyl group, 1-fluorobutyl group, 1-chloroethyl group, 1-chloropropyl group, 1-chlorobutyl group, 1-aminoethyl group, 2-aminoethyl groups, 1-dimethylaminoethyl group, 2-dimethylaminoethyl group, 1-acetoaminoethyl group, 2-acetoaminoethyl groups, acetylmethyl group, 1-phenylthioethyl group, 2-phenylthioethyl group, 1-nitroethyl group, 2-nitroethyl group, 1-cyanoethyl group, 2-cyanoethyl group, phenylsulfonylmethyl group, and di(phenylsulfonyl)methyl group.

Of these unsubstituted and substituted mono-valent acyclic hydrocarbon groups, a methyl group, ethyl group, t-butyl group, $CH_2=CH-$, $CH_2=C(CH_3)-$, fluoromethyl group, chloromethyl group, bromomethyl group, 2-dimethylaminoethyl group, acetyl methyl group, and di(phenylsulfonyl) methyl group are particularly desirable.

Further, as examples of other mono-valent organic groups containing hetero atoms represented by X or Y, a hydroxyl group, methoxy group, ethoxy group, n-propoxy group, iso-propoxy group, cyano group, dimethylaminocarbonyl group, 4-bromobenzoyl group, 2-pyridinyl group, and 4-pyridinyl group can be given.

In addition, X and Y may in combination form a mono- or poly-cyclic structure containing at least one unsaturated bond. The following tetra- to hexacyclic compounds can be given as examples of such a monocyclic structure.

Tetracyclic compounds: 2-Cyclobutene-1-ylidene, etc.
Pentacyclic compounds: 2-Cyclopentene-1-ylidene, 3-cyclopenten-1-ylidene, 2,4-cyclopentadiene-1-ylidene, etc.
Hexacyclic compounds: 2-Cyclohexene-1-ylidene, 3-cyclohexene-1-ylidene, 2,4-cyclohexadiene-1-ylidene, 2,5-cyclohexadiene-1-ylidene, etc.
Heptacyclic compounds: 2-Cycloheptene-1-ylidene, 3-cycloheptene-1-ylidene, 4-cycloheptene-1-ylidene, 2,4-cycloheptadiene-1-ylidene, 2,5-cycloheptadiene-1-ylidene, 2,6-cycloheptadiene-1-ylidene, 3,5-cycloheptadiene-1-ylidene, 2,4,6-cycloheptatriene-1-ylidene, etc.

As examples of the polycyclic structure formed in combination by X and Y are the structures formed by condensation of benzene rings to these tetra- to heptacyclic compounds. Specific examples include cyclic structures originating from 1(2H, 3H)-indenylidene, 2(2H, 3H)-indenylidene, 1-indenylidene, 1-fluoronylidene, 1(2H, 3H, 4H)-naphthylidene, 2-(1H, 3H, 4H)-naphthylidene, 1(4H)-naphthylidene, 1(2H)-naphthylidene, 2(1H)-naphthylidene, 9(10H)-phenanthrylidene, or 9(10H)-anthrylidene.

As specific examples of these disulfonylmethane derivatives used as the acid generator (A) in the present invention, particularly those wherein (i) at least one of X and Y is an aryl group or (ii) X and Y in combination form a monocyclic or poly-cyclic structure containing one unsaturated bond, the compounds shown by the following formulas (3) to (84) are given.

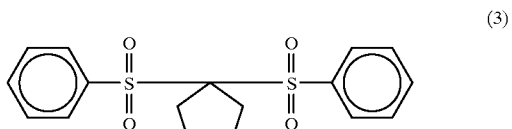

(3)

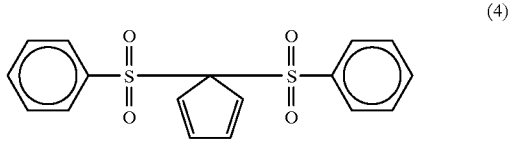

(4)

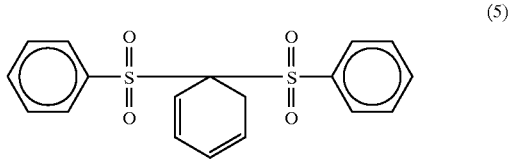

(5)

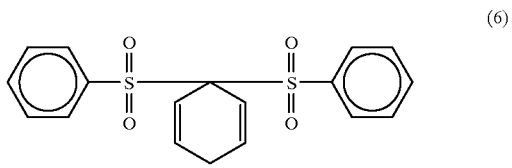

(6)

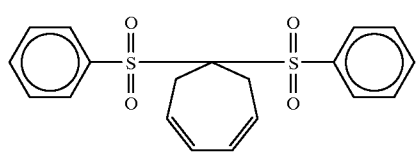
(7)
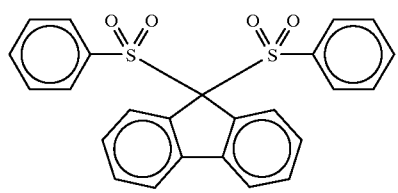
(8)
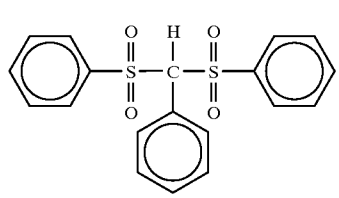
(9)
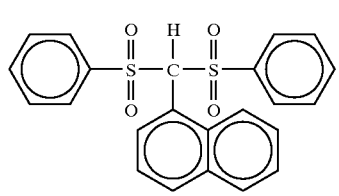
(10)
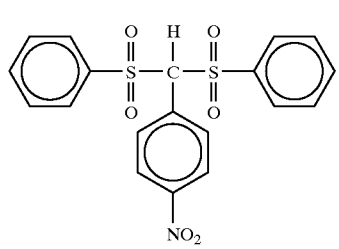
(11)
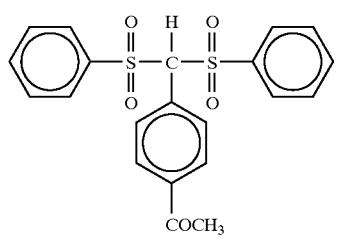
(12)
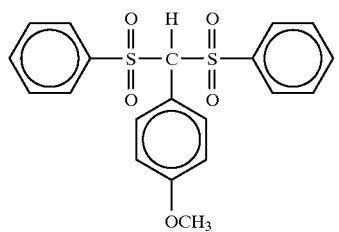
(13)
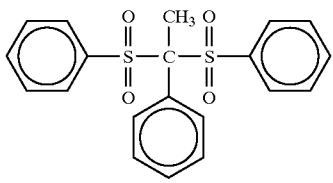
(14)
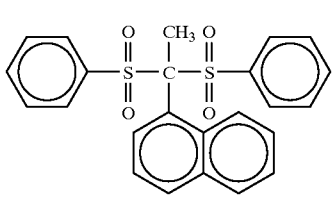
(15)
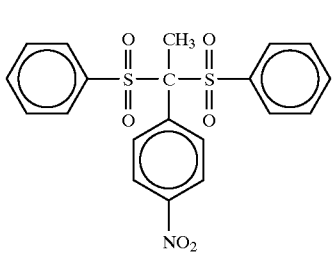
(16)
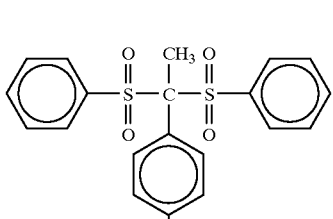
(17)
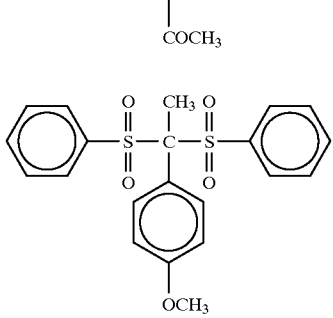
(18)
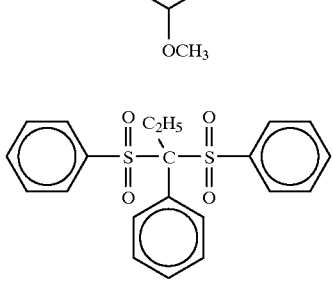
(19)
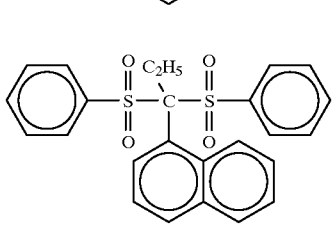
(20)

(21) 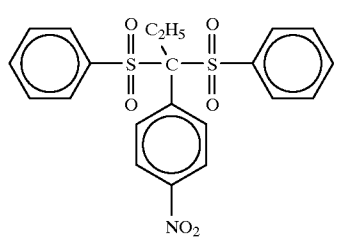
(22) 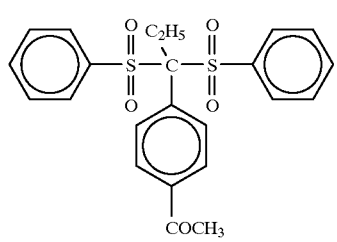
(23) 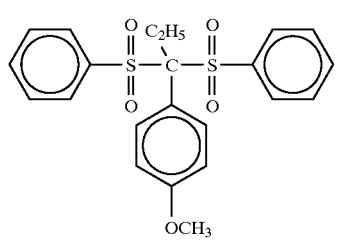
(24) 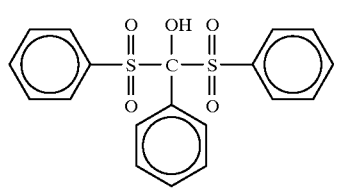
(25) 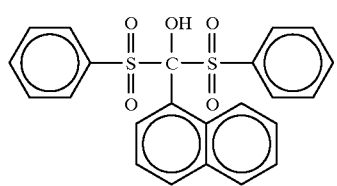
(26) 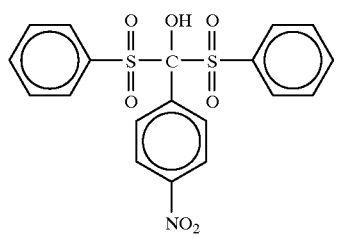
(27) 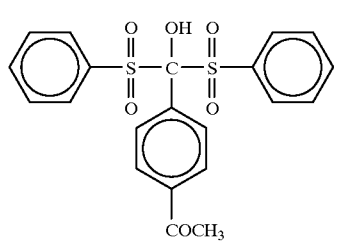
(28) 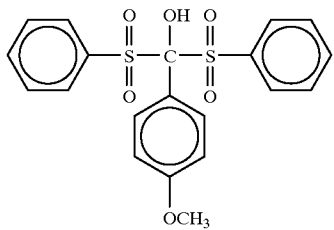
(29) 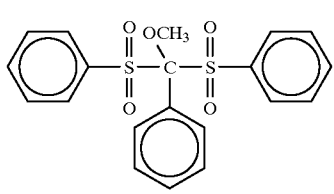
(30) 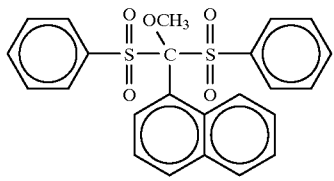
(31) 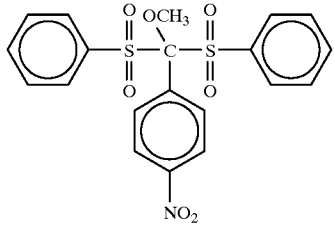
(32) 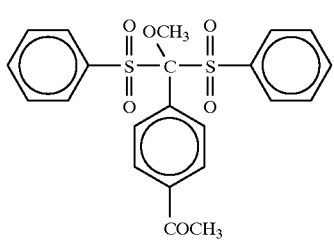
(33) 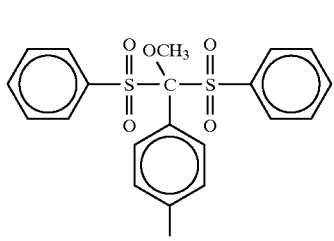

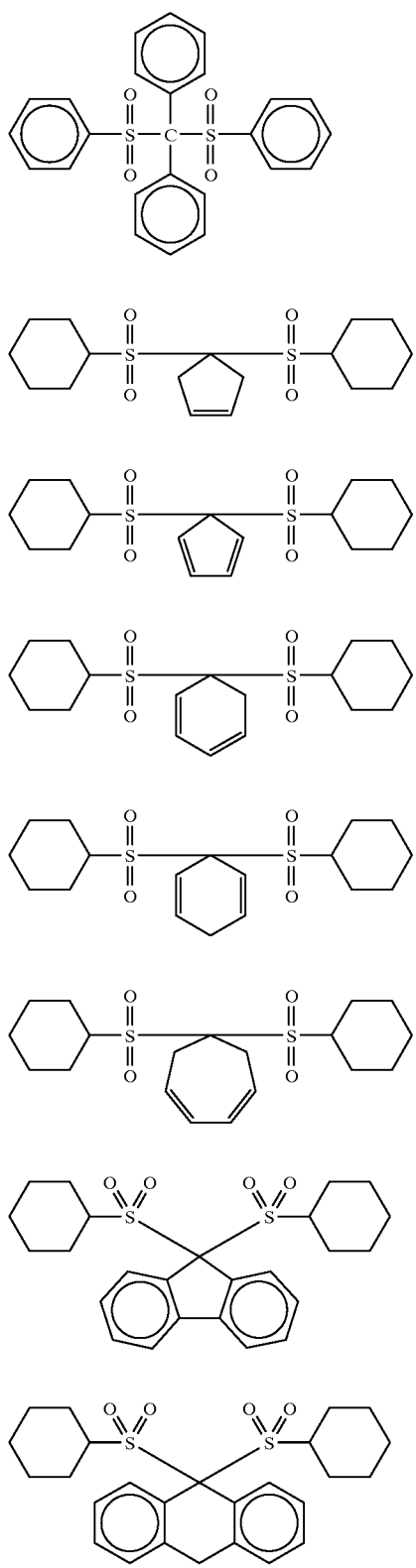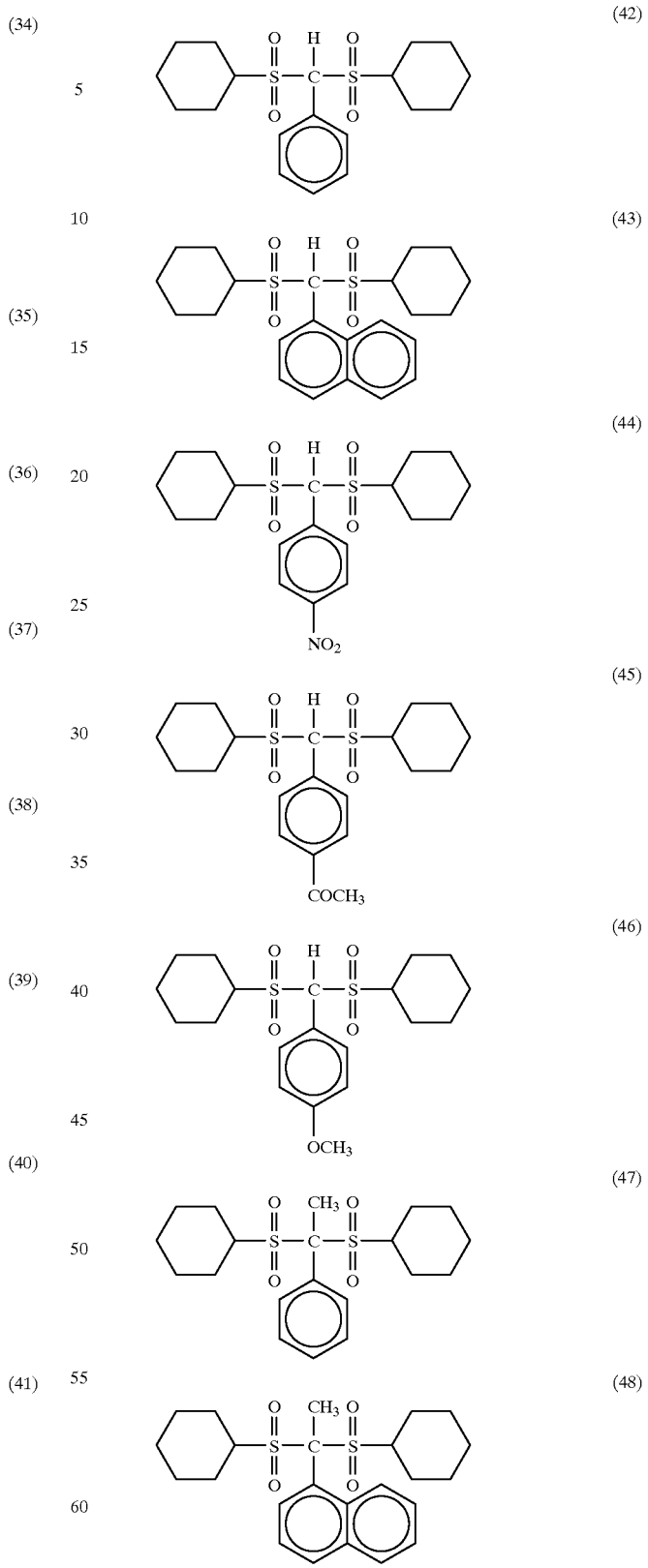

(49) 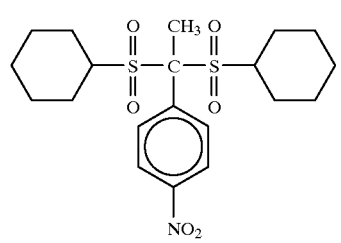
(50) 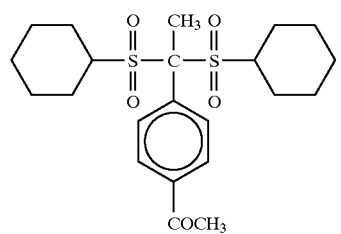
(51) 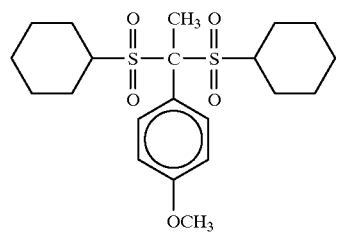
(52) 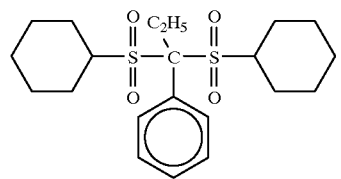
(53) 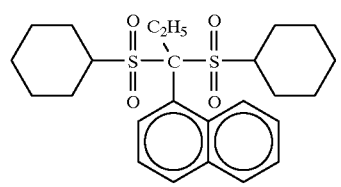
(54) 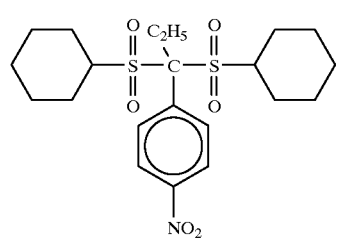
(55) 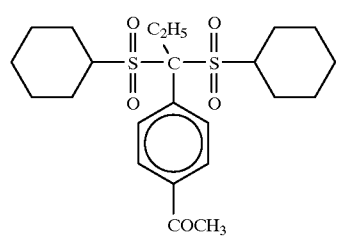
(56) 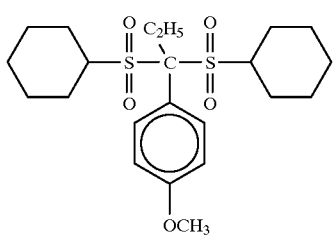
(57) 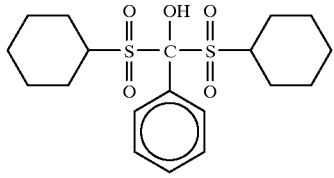
(58) 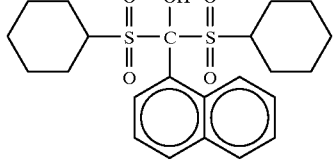
(59) 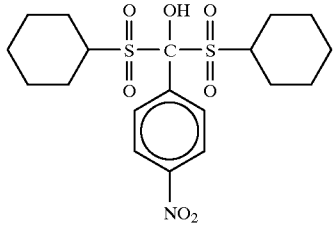
(60) 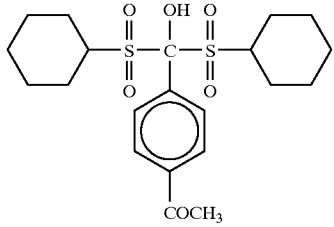
(61) 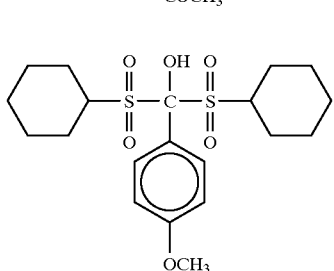
(62) 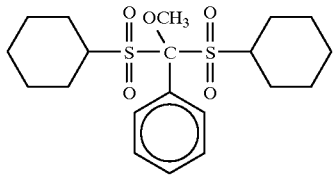

(63) 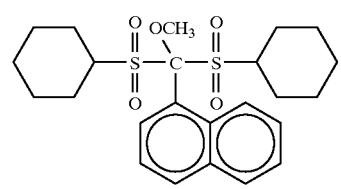
(64) 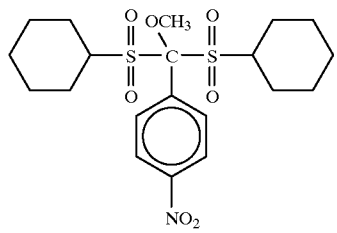
(65) 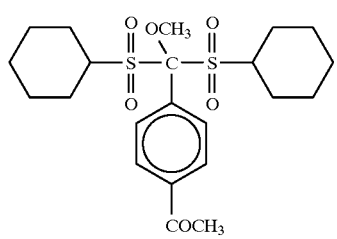
(66) 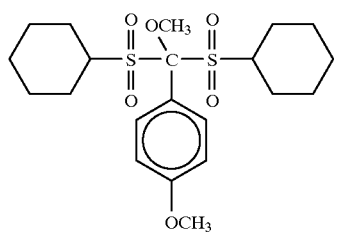
(67) 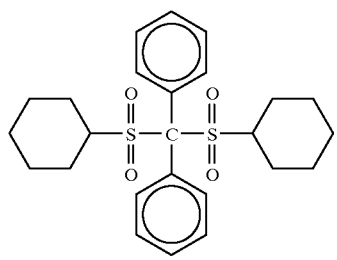
(68) 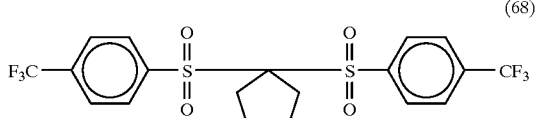
(69) 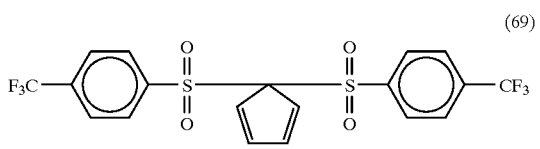
(70) 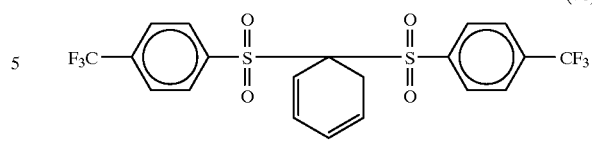
(71) 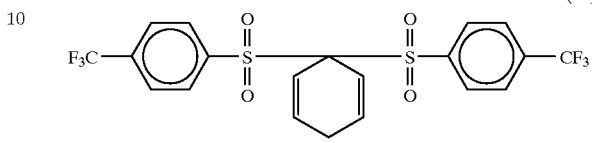
(72) 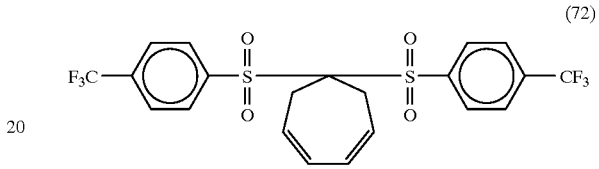
(73) 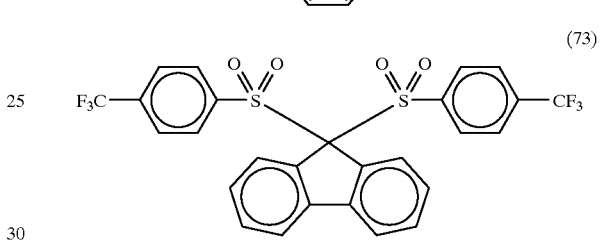
(74) 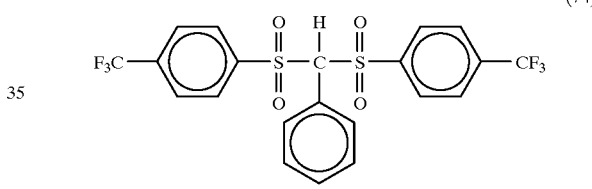
(75) 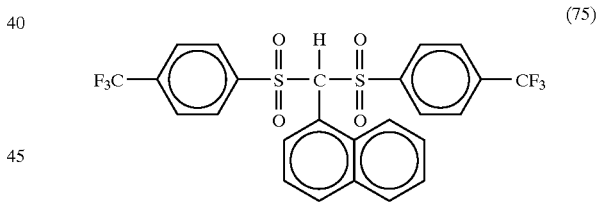
(76) 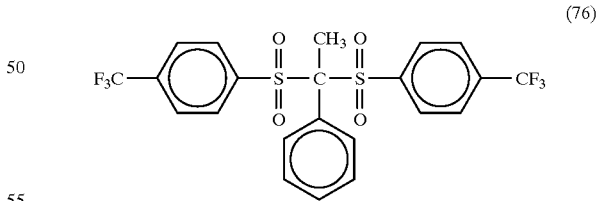
(77) 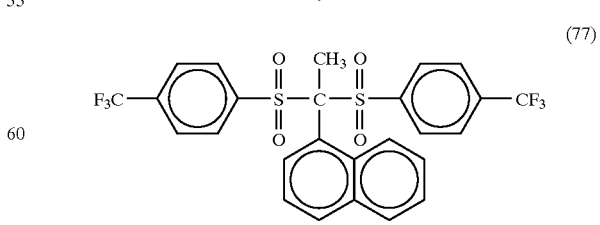

-continued

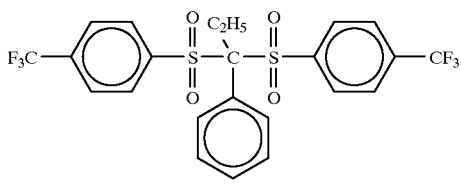
(78)

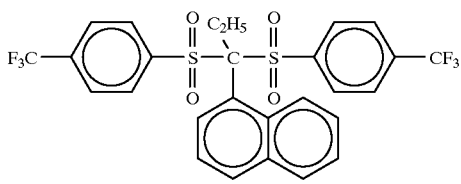
(79)

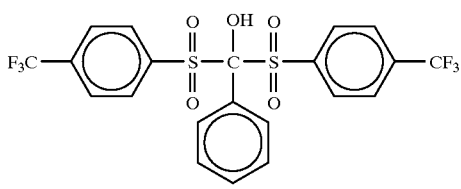
(80)

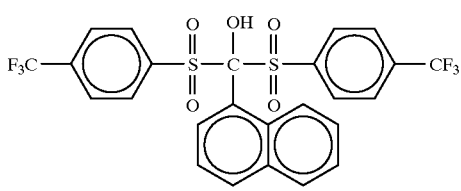
(81)

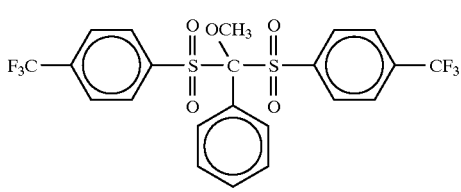
(82)

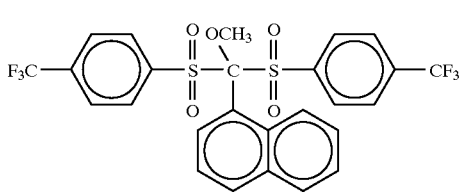
(83)

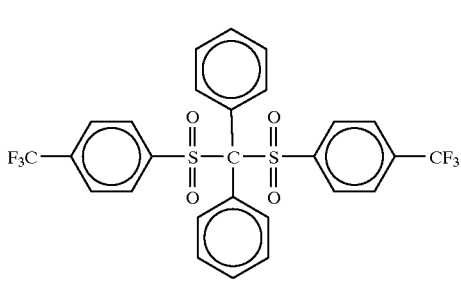
(84)

Of these disulfonylmethane derivatives, particularly preferred compounds are the compounds of formula (3), formula (4), formula (5), formula (6), formula (7), formula (9), formula (10), formula (14), formula (15), formula (24), formula (25), formula (34), formula (36), formula (37), formula (39), formula (40), formula (41), formula (43), formula (47), formula (48), formula (52), formula (53), formula (57), formula (58), formula (67), formula (69), formula (70), formula (72), formula (74), formula (75), formula (76), formula (77), formula (80), formula (81), and formula (84).

In these disulfonylmethane derivatives (A), those having groups which do not absorb the wavelength of deep ultraviolet rays such as from an excimer laser, such as a cyclohexyl group or the like, for $R^1$ and $R^2$ in formula (1), X and/or Y in the formula (1) should be the group capable of absorbing light with such a wavelength.

The above-described disulfonylmethane derivatives (A) can be synthesized by a known process, for example, any one of the following processes (i) to (iii).

(i) As an example of disulfonylmethane derivatives (A) wherein X and Y form in combination a mono-cyclic or poly-cyclic structure containing at least one unsaturated bond, in the case of 1,1-bis(phenylsulfonyl)-3-cyclopentene of the above formula (2), thiophenol and methylene chloride are first subjected to a substitution reaction in the presence of a base to produce bis (phenylthio)methane, which is then subjected to an oxidation reaction to obtain bis(phenylsulfonyl) methane. Hydrogen peroxide, carboxylic acid peroxide (for example, m-chloroperbenzoic acid), or the like can be used as an oxidizing agent in the oxidation reaction. Then, bis(phenylsulfonyl) methane and cis-1,4-dichlorobutan-2-ene are subjected to a cyclization reaction in the presence of a base, thereby obtaining 1,1-bis(phenylsulfonyl)-3-cyclopentene.

(ii) As an example of disulfonylmethane derivatives (A) wherein either one of X and Y is an aryl group, in the case of bis (phenylsulfonyl)-phenylmethane the foregoing formula (9), thiophenol and benzaldehyde are made first reacted in the presence of an acid to synthesize bis(phenylthio)-phenyl methane, followed by an oxidation reaction to obtain bis(phenylsulfonyl)-phenyl methane. The oxidizing agents described in connection with the process (i) can also be used as the oxidizing agent in this oxidation reaction.

(iii) As an example of disulfonylmethane derivatives (A) wherein both X and Y are aryl groups in the formula (1), in the case of bis(phenylsulfonyl)-diphenylmethane of the above formula (34), the bis (phenylsulfonyl)-diphenylmethane can be obtained in the same manner as in the process (ii) above, except benzaldehyde is used instead of benzophenone.

Next, disulfonylmethane derivatives of the formula (1) wherein X and Y in combination form a cyclic structure of the above formula (2) will be illustrated. In the formula (2), X' and Y' may be the same or different and each individually represents a hydrogen atom, halogen atom, alkyl group having 1–10 carbon atoms, cycloalkyl group having 3–10 carbon atoms, aralkyl group having 6–20 carbon atoms, or aryl group having 7–20 carbon atoms, or X' and Y' which are bonded to the same or different carbon atoms form tri- to deca-cyclic structure of carbons; and n is an integer from 2–10.

Fluorine atom, chlorine atom, bromine atom, and iodine atom are given as examples of the halogen atom represented by X' or Y'.

The alkyl group having 1–10 carbon atoms represented by X' or Y' maybe either linear or branched and include, for example, a methyl group, ethyl group, n-propyl group, isopropyl group, n-butyl group, sec-butyl group, t-butyl group, n-pentyl group, neopentyl group, n-hexyl group, n-heptyl group, n-octyl group, n-nonyl group, and n-decyl group. These alkyl groups may have one or more substituents in suitable positions.

Given as examples of the substituents for the alkyl groups are halogen atoms (for example, a fluorine atom, chlorine atom, bromine atom, and iodine atom), an amino group, dialkylamino group, acetoamino group, acyl group, acyloxo group, alkylthio group, arylthio group, nitro group, cyano group, arylsulfonyl group, and hydroxyl group.

Given as specific examples of the alkyl groups having these substituents are a fluoromethyl group, difluoromethyl group, trifluoromethyl group, chloromethyl group, dichloromethyl group, trichloromethyl group, 1-fluoroethyl group, 1-fluoropropyl group, 1-fluorobutyl group, 1-chloroethyl group, 1-chloropropyl group, 1-chlorobutyl group, 1-aminoethyl group, 2-aminoethyl groups, 1-dimethylaminoethyl group, 2-dimethylaminoethyl group, 1-acetoaminoethyl group, 2-acetoaminoethyl groups, acetylmethyl group, 1-phenylthioethyl group, 2-phenylthioethyl group, 1-nitroethyl group, 2-nitroethyl group, 1-cyanoethyl group, 2-cyanoethyl group, phenylsulfonylmethyl group, di(phenylsulfonyl)methyl group, and the like.

A cyclopropyl group, cyclobutyl group, cyclopentyl group, cyclohexyl group, cycloheptyl group, and cyclooctyl group can be given as examples of the cycloalkyl group having 3–10 carbon atoms represented by $X'$ or $Y'$.

These cycloalkyl groups may have one or more substituents in any suitable position.

Examples of the substituents for cycloalkyl groups include alkyl groups, in addition to those groups previously described in connection with the substituents for monovalent acyclic hydrocarbon groups.

Given as specific examples of the cycloalkyl groups having these substituents are a 4-methylcyclohexyl group, 4-fluorocyclohexyl group, 2-chlorocyclohexyl group, 4-chlorocyclohexyl group, 4-bromocyclohexyl group, and 4-nitrocyclohexyl group.

Furthermore, as examples of the aryl group having 6–20 carbon atoms represented by $X'$ or $Y'$, given are a phenyl group, biphenylyl group, 1-naphthyl group, 2-naphthyl groups, 1-anthryl group, 9-anthryl group, and phenanthryl groups.

These aryl groups may have one or more substituents in any suitable position.

Givens as examples of the substituent in the aryl groups are an alkyl group having 1–6 carbon atoms, such as a methyl group, ethyl group, n-propyl group, isopropyl group, n-butyl group, sec-butyl group, t-butyl group, n-pentyl group, n-hexyl group, or perfluoro alkyl groups originating from these alkyl groups; a halogen atom, such as a fluorine atom, chlorine atom, bromine atom, or iodine atom; alkoxyl groups having 1–6 carbon atoms, such as a methoxy group, ethoxy group, n-propoxy group, iso-propoxy group, n-butoxy group, sec-butoxy group, or t-butoxy group; acyl groups having 2–11 carbon atoms, such as an acetyl group, propionyl group, butyryl group, hexanoyl group, octanoyl group, or benzoyl group; an acyloxy group having 2–11 carbon atoms, such as an acetyloxy group, propionyloxy group, butyryloxy group, hexanoyloxy group, octanoyloxy group, or benzoyloxy group; aralkyl groups having 7–20 carbon atoms, such as a benzyl group, diphenylmethyl group, 2-phenylethyl group, 2-phenylpropyl group, and 3-phenylpropyl group; and a nitro group, cyano group, hydroxyl group, vinyl group, acetoamino group, and butoxy carbonyloxy.

Specific examples of the aryl group having substituents include a 4-methylphenyl group, 4-ethylphenyl group, 4-n-propylphenyl group, 4-isopropylphenyl group, 4-n-butylphenyl group, 4-sec-butylphenyl group, 4-t-butylphenyl group, 2,4,6-trimethylphenyl group, 2,4,6-triethylphenyl group, 2,4,6-tri-n-propylphenyl group, 2,4,6-tri-isopropylphenyl group, 4-trifluoromethylphenyl group, 4-fluorophenyl group, 4-chlorophenyl group, 4-bromophenyl group, 4-methoxyphenyl group, 4-ethoxyphenyl group, 3,4-dimethoxyphenyl group, 2-benzoylphenyl group, 4-acetyloxyphenyl group, 4-benzylphenyl group, 4-hydroxyphenyl group, 3,5-dimethyl-4-hydroxyphenyl group, 2-nitrophenyl group, 4-nitrophenyl group, 2,4-dinitrophenyl group, and 4-acetoaminophenyl group.

Of these unsubstituted or substituted aryl groups, particularly preferred are a phenyl group, 4-methylphenyl group, 4-t-butylphenyl group, 2,4,6-tri-isopropylphenyl group, 4-fluorophenyl group, 4-chlorophenyl group, 4-bromophenyl group, 4-methoxyphenyl group, 2-nitrophenyl group, and 4-nitrophenyl group.

Further, given as examples of the aralkyl group having 7–20 carbon atoms represented by $X'$ or $Y'$ are a benzyl group, diphenyl methyl group, 3,5-diphenylbenzyl group, 2-phenylethyl group, 3-phenylpropyl group, 1-naphthylmethyl group, 2-naphthylmethyl group, 1-anthranylmethyl group, and 9-anthranylmethyl group. These aralkyl groups may have one or more substituents in any suitable position.

As the substituent groups on these aralkyl groups, the same groups described as the substituents in the illustration of the aryl groups can be used.

Specific examples of the aralkyl groups having such substituents include a 4-methylbenzyl group, 4-ethylbenzyl group, 4-n-propylbenzyl group, 4-isopropylbenzyl group, 4-n-butylbenzyl group, 4-t-butylbenzyl group, 4-fluorobenzyl group, 4-methoxybenzyl group, 4-acetyloxybenzyl group, 2-nitrobenzyl group, 4-nitrobenzyl group, 2,4-dinitrobenzyl group, 4-cyanobenzyl group, 4-hydroxybenzyl group, and 4-vinylbenzyl group.

Among these substituted and unsubstituted aralkyl groups, particularly preferred are a benzyl group, 9-anthranylmethyl group, 4-fluorobenzyl group, 4-methoxybenzyl group, 2-nitrobenzyl group, and 4-nitrobenzyl group.

In addition, as the integer represented by n in the formula (1), integers 3–6 are preferred.

Of these acid generators (A) which are the formula (1) disulfonylmethane derivatives having the cyclic structure of the formula (2), particularly preferred compounds are 1,1-bis(phenylsulfonyl)cyclobutane, 1,1-bis(phenylsulfonyl)-cyclopentane, 1,1-bis(phenylsulfonyl)cyclohexane, 1,1-bis(phenylsulfonyl)cycloheptane, 1,1-bis(4-methylphenylsulfonyl)cyclobutane, 1,1-bis(4-methylphenylsulfonyl)cyclopentane, 1,1-bis(4-methylphenylsulfonyl)cyclohexane, and 1,1-bis(4-methylphenylsulfonyl)cycloheptane.

These acid generators (A) which are the formula (1) disulfonylmethane derivatives having the cyclic structure of the formula (2) can be prepared by a known process. A typical process comprises a substitution reaction of a thiol compound of the formula $R^1$-SH and a thiol compound of the formula $R^2$-SH [$R^1$ and $R^2$ are the same as $R^1$ and $R^2$ in the formula (1)] and methylene chloride in the presence of a base, to produce a bisthiomethane compound, followed by an oxidation reaction to obtain a bissulfonylmethane compound. As the oxidizing agent which is used in this oxidation reaction, hydrogen peroxide, carboxylic acid peroxide (for example m-chloroperbenzoate), and the like can be used.

The resulting bissulfonylmethane compound is then subjected to a cyclization reaction in the presence of a base and a terminal halide of the formula, Z-[C(X')(Y')]$_n$-Z, wherein X', Y', and n are respectively the same as X', Y', and n in the formula (2), and Z is a halogen atom, with the two Zs being either the same or different.

Acid Decomposable Group-containing Resins
<Component (B) (a)>

A resin protected by an acid decomposable group, which is insoluble or scarcely soluble in alkali but becomes soluble when the acid decomposable group is released, is used as the component (B)(a) in the first invention. This resin is made from a resin containing at least one acidic functional group, such as a phenolic hydroxyl group or carboxyl group, for example, from an alkali soluble resin having a repeating unit shown by any one of the hereinafter described formulas (85) to (88), by replacing a hydrogen atom in the acidic functional group with at least one acid decomposable group which is decomposable in the presence of an acid. This resin is alkali insoluble or scarcely soluble in alkali by itself.

The term "insoluble or scarcely soluble in alkali" is defined as the characteristics of a resin (an acid decomposable group-containing resin), in which at least 50% (in thickness) of the coating prepared from the resin remains undissolved when developed under the same alkaline developing conditions as the conditions under which resist patterns are formed on a resist coating made from a radiation sensitive resin composition containing the acid decomposable group-containing resin.

The acid decomposable group in the acid decomposable group-containing resin includes substituted methyl groups, 1-substituted ethyl groups, 1-branched alkyl groups, silyl groups, germyl groups, alkoxycarbonyl groups, acyl groups, and cyclic acid decomposable protective groups.

Given as examples of the substituted methyl groups are a methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, isopropoxycarbonylmethyl group, n-butoxycarbonylmethyl group, and t-butoxycarbonylmethyl group.

Examples of the 1-substitution ethyl groups include a 1-methoxyethyl group, 1-methylthioethyl group, 1,1-dimethoxyethyl group, 1-ethoxyethylgroup, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-iso-propoxycarbonylethyl group, 1-n-butoxycarbonylethyl group, and 1-t-butoxycarbonylethyl group.

Examples of the 1-branched alkyl groups include an isopropyl group, sec-butyl group, t-butyl group, 1,1-dimethylpropyl group, 1-methylbutyl group, and 1,1-dimethylbutyl group.

Given as examples of the silyl groups are a trimethyl silyl group, ethyldimethyl silyl group, methylcliethyl silyl group, triethyl silyl group, isopropyldimethyl silyl group, methyldiisopropyl silyl group, tri-isopropyl silyl group, t-butyldimethyl silyl group, methyl-di-t-butyl silyl group, tri-t-butyl silyl group, phenyldimethyl silyl group, methyl-di-phenyl silyl group, and triphenyl silyl group.

Included in the examples of the germyl groups are a trimethyl germyl group, ethyldimethyl germyl group, methyldiethyl germyl group, triethyl germyl group, isopropyldimethyl germyl group, methyl-di-isopropyl germyl group, triisopropyl germyl group, t-butyldimethyl germyl group, methyl-di-t-butyl germyl group, tri-t-butyl germyl group, phenyldimethyl germyl group, methyl-di-phenyl germyl group, and triphenyl germyl group.

Given as examples of the alkoxycarbonyl groups are a methoxycarbonyl group, ethoxycarbonyl group, isopropoxycarbonyl group, and t-butoxycarbonyl group.

Examples of the acyl groups include an acetyl group, propionyl group, butyryl group, butanoyl group, hexanoyl group, valeryl group, pivaloyl group, iso-valeryl group, lauryloyl group, myristoyl group, palmitoyl group, stearoyl group, oxalyl group, malonyl group, scucinyl group, glutary group, adipoyl group, piperoyl group, suberoyl group, azelaoyl group, sebacoyl group, acryloyl group, propioyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluene sulfonyl group, and mesyl group.

Further, given as examples of the cyclic acid decomposable groups are a cyclopropyl group, cyclopentyl group, cyclohexyl group, cyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group.

Among these acid decomposable groups particularly preferred groups are a t-butyl group, benzyl group, 1-methoxyethyl group, 1-ethoxyethyl group, trimethyl silyl group, t-butoxycarbonyl group, t-butoxycarbonyl methyl group, tetrahydropyranyl group, tetrahydrofuranyl group, tetrahydrothiopyranyl group, and tetrahydrothiofuranyl group.

Although the amount of the acid decomposable groups to be introduced to the acid decomposable group-containing resins (the percentage of the number of the acid decomposable groups in the total number of the acidic functional groups and the acid decomposable groups in the resin) is varied according to the kinds of alkali-soluble resin and therefore cannot generically be specified, usually an amount of 10–100%, preferably 15–100%, of such groups is incorporated in the resin.

Moreover, the molecular weight reduced to polystyrene of the acid decomposable group-containing resin (hereinafter referred to as Mw) measured by gel permeation chromatography is preferably 1,000–150,000, and particularly preferably 3,000–100,000.

The acid decomposable group-containing resin can be prepared, for example, by introducing at least one acid decomposable group into the alkali-soluble resin; by (co) polymerization of monomers containing at least one acid decomposable group; or by (co)polycondensation of polycondensable components containing at least one acid decomposable group.

Particularly preferred acid decomposable group-containing resins used in the first invention are a resin with a part of the hydrogen atoms in the hydroxyl groups of poly(hydroxystyrene) replaced by the above-described acid decomposable groups and a resin with a part or all of the hydrogen atoms in the hydroxyl groups and/or in carboxyl groups in the copolymer of hydroxystyrene and/or hydroxy-α-methyl styrene and (meth)acrylic acid replaced by the above-described acid decomposable groups. Ideal acid decomposable group-containing resins are a poly(hydroxystyrene) resin in which 10–100 mol % of hydrogen atoms on a phenolic hydroxyl group is replaced by a t-butoxy carbonyl group, a poly(hydroxystyrene) resin in which 10–100 mol % of hydrogen atoms on a phenolic hydroxyl group is replaced by a t-butoxy carbonyl methyl group, a poly(hydroxystyrene) resin in which 10–100 mol % of hydrogen atoms on a phenolic hydroxyl group is replaced by a 1-ethoxyethyl group, and a copolymer of hydroxy-α-methyl styrene and t-butyl acrylate.

These acid decomposable group-containing resins possess characteristics of controlling the solubility of alkali-soluble resins in an alkali solution. That is to say, these resins are decomposed in the presence of an acid and can exhibit the action of reducing or eliminating the alkali-insolubility of the resin, or the action of accelerating dissolving of the alkali-soluble resin in an alkali. These resins can thus be included in the alkali-solubility controlling agent (Component (B)(b)) in the first invention.

The acid decomposable group containing resins may be used either individually or in combinations of two or more.

Alkali-soluble Resins <Component (B)(b)>

The alkali-soluble resins used in the first invention as the component (B)(b) and in the second invention as the component (C) are resins soluble in alkaline developing solutions. These resins possess at least one acidic functional group exhibiting affinity to alkaline developing solutions such as, for example, a phenolic hydroxyl group or carboxyl group.

Specific examples of such resins are an addition polymerization resin possessing at least one repeating unit represented by the following formulas (85) to (87) and a polycondensation resin which possesses at least one repeating unit represented by the following formula (88).

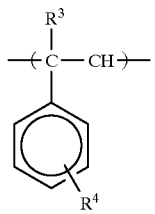
(85)

wherein $R^3$ is a hydrogen atom or a methyl group and $R^4$ is —OH, —COOH, —$R^5$COOH, —O$R^5$COOH, or —OCOR$^5$COOH (provided that $R^5$ represents a group —(CH)g—, wherein g is an integer from 1–4);

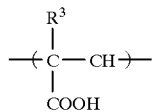
(86)

wherein $R^3$ is a hydrogen atom or a methyl group;

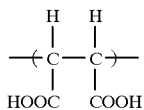
(87)

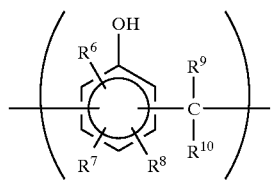
(88)

wherein $R^6$, $R^7$, $R^8$, $R^9$, and $R^{10}$ may be the same or different and each individually represents a hydrogen atom or an alkyl group having 1–4 carbon atoms.

When the alkali-soluble resin is an addition polymerization resin, such a resin may be formed from only the repeating units shown by the formulas (85) to (37), although it is possible for the resin to contain other repeating units inasmuch as the resin is soluble in an alkaline developing solution.

Examples of such other repeating units include those formed by the cleavage of polymerizable double bonds derived from monomers such as styrene, α-methylstyrene, vinyltoluene, maleic anhydride, (meth)acrylonitrile, crotonitrile, maleinitrile, fumaronitrile, mesaconitrile, citraconitrile, itaconitrile, (meth)acryamide, crotonamide, maleinamide, fumaroamide, mesaconamide, citraconamide, itaconamide, vinylaniline, vinylpyridien, vinyl-ε-caprolactum, vinylpyrrolidon, and vinylimidazole.

The above addition polymerization resin can be prepared, for example, by (co)polymerizing at least one monomer corresponding to the repeating units of the formulas (85) to (87), optionally in combination with other monomers corresponding to other repeating units.

The (co)polymerization reaction can be carried out by bulk polymerization, solution polymerization, precipitation polymerization, emulsion polymerization, suspension polymerization, or bulk-suspension polymerization, in which polymerization initiators and polymerization catalysts (e.g., radical polymerization catalysts, anionic polymerization catalysts, conjugated anionic polymerization catalysts, cationic polymerization catalysts) are suitably selected depending on the kinds of monomers and reaction media.

In the case where condensed polymer is used as the alkali-soluble resin, although it is possible that such a resin consists only of the repeating unit shown by the formula (88), other repeating units may be additionally contained inasmuch as the resulting resin is soluble in an alkali developer. Such condensed polymers can be manufactured by the (co)polycondensation of at least one phenol compound and at least one aldehyde compound, optionally, together with other polycondensable compounds, in an aqueous medium or in a mixture of water and a solvent having affinity with water in the presence of an acid catalyst.

Here, given as examples of phenol compounds are o-cresole, p-cresole, 2,3-xylenol, 2,4-xylenol, 2,5-xylenol, 3,4-xylenol, 3,5-xylenol, 2,3,5-trimethylphenol, and 3,4,5-trimethylphenol; and as aldehyde compounds, formaldehyde, trioxane, para-formaldehyde, benzaldehyde, acetaldehyde, propylaldehyde, and phenylacetaldehyde.

The amount of the repeating units of the formulas (85) to (88) in the alkali-soluble resin cannot be generically determined, because such an amount varies depending on the other repeating units which are optionally incorporated. Typically, this amount is 10–100 mol %, and preferably 20–100 mol %.

The Mw of the alkali-soluble resin varies according to the characteristics desired of the resin. Typically, a preferable range of Mw is 1,000–150,000, and particularly preferably 3,000–100,000.

The alkali-soluble resins maybe hydrogenated in the case where they contain repeating units having unsaturated carbon-carbon bonds, such as those shown by the formula (85) (88), or the like. The degree of hydrogenation to saturate 70% or less, preferably 50% or less, and more preferably 40% or less, of the unsaturated carbon-carbon bonds contained in such repeating units is sufficient. If the degree of hydrogenation exceeds 70%, the developing characteristics may be impaired when the alkali-soluble resins are developed with an alkaline developer.

Particularly preferredalkali-soluble resins used in the first and second inventions are those containing polystyrene, copolymers of poly(hydroxystyrene) and hydroxy-α-methylstyrene, and copolymers of hydroxystyrene and styrene, as major components.

The alkali-soluble resin may be used either individually or in combinations of two or more in the first and second inventions.

Alkali-solubility Control Agent <Component (B)(b)>

As the alkali-solubility control agent used as the component (B) (b) in the first invention, compounds with at least one substituent decomposable in the presence of an acid (hereinafter referred to as "acid decomposable substituent") introduced to acidic functional groups such as a phenolic hydroxyl group or carboxyl group can be given.

The same 1-substituted ethyl group, silyl group, 1-branched alkyl group, germyl group, alkoxy carbonyl group, acyl group, and cyclic acid decomposable group as given in the description of the acid decomposable group containing resin can be given as examples of such an acid decomposable substituent used here.

Either low molecular compounds or high molecular compounds can be used as the alkali-solubility control agents. The compounds with the following formulas (89) to (93) can be given as specific examples of low molecular compounds which can be used as the alkali-solubility control agent.

(89)

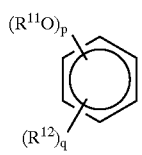

wherein $R^{11}$ indicates an acid decomposable group which may be a 1-substituted methyl group, 1-substituted ethyl group, 1-branched alkyl group, silyl group, germyl group, alkoxy carbonyl group, acyl group, or cyclic acid decomposable group, with a plurality of $R^{11}$s being either the same or different, $R^{12}$ represents an alkyl group having 1–4 carbon atoms, phenyl group, or 1-naphthyl group, with a plurality of $R^{12}$s being either the same or different, p is an integer of 1 or more, q is an integer of 0 or more, provided that $p+q \leq 6$.

(90)

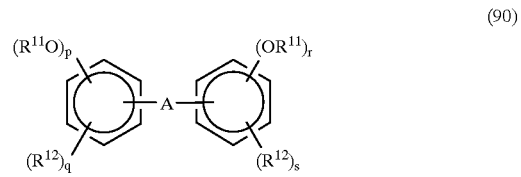

wherein $R^{11}$ and $R^{12}$ are the same as those defined for formula (89) and A represents a single bond of —S—, —O—, —C, —COO—, —SO—, —SO$_2$—, or —C($R^{13}$)($R^{14}$)—(wherein $R^{13}$ and $R^{14}$, which nay be either the same or different, represent a hydrogen atom, alkyl group having 1–6 carbon atoms, acyl group having 2–11 carbon atoms, phenyl group, or naphthyl group), or a group,

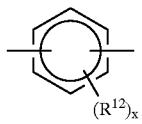

(wherein $R^{12}$ is the same as defined above and x is an integer from 0 to 4), p, q, r, and s are respectively an integer of 0 or more, provided that $p+q \leq 5$, $r+s \leq 5$, and $p+r \geq 1$.

(91)

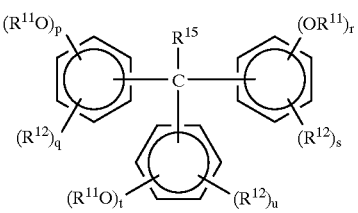

wherein $R^{11}$ and $R^{12}$ are the same as defined for the formula (89), $R^{15}$ is a hydrogen atom, an alkyl group having 1–4 carbon atoms, or a phenyl group and p, q, r, s, t, and u are respectively an integer of 0 or more, provided that $p+q \leq 5$, $r+s \leq 5$, $t+u \leq 5$, and $p+r+t \geq 1$.

(92)

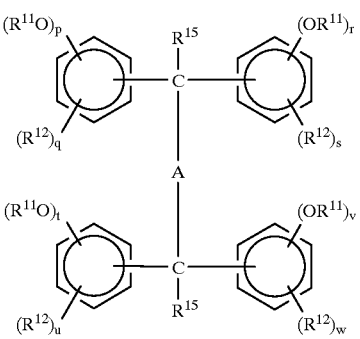

wherein $R^{11}$ and $R^{12}$ are the same as defined for the formula (89), A is the same as defined for the formula (90), and $R^{15}$ is the same as defined for the formula (91), with a plurality of $R^{15}$s being either the same or different, and p, q, r, s, t, U, v, and w are respectively an integer of 0 or more, provided that $p+q \leqq 5$, $r+s \leqq 5$, $t+u \leqq 5$, $v+w \leqq 5$, and $p+r+v \geqq 1$

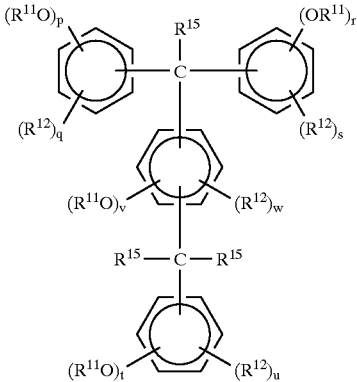
(93)

wherein $R^{11}$ and $R^{12}$ are the same as defined for the formula (89), $R^{15}$ is the same as defined for the formula (91), with a plurality of $R^{15}$s being either the same or different, and p, q, r, s, t, u, v, and w are respectively an integer of 0 or more, provided that $p+q \leqq 5$, $r+s \leqq 5$, $t+u \leqq 5$, $v+w \leqq 4$, and $p+r+t+v \geqq 1$.

As the high molecular weight alkali-solubility control agent, the above-mentioned acid decomposable group-containing resins, for example, can be used.

Particularly preferred alkali-solubility control agents used in the first invention are the compounds shown by the following formulas (94) or (95).

Crosslinking Agents

The crosslinking agent used in the second invention is a compound which can crosslink alkali-soluble resins in the presence of an acid, for example, the acid generated by exposure to light. As an example of such a crosslinking agent, a compound having at least one substituent which exhibits crosslinking reactivity with the alkali-soluble resin can be given (such a group is hereinafter referred to as "crosslinkable substituent").

The following groups (96)–(100) are given as specific examples of the crosslinkable substituents.

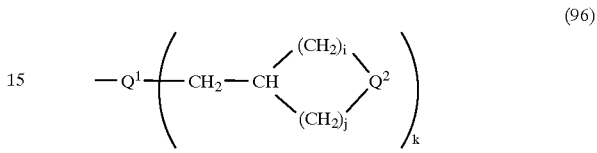
(96)

wherein k is 1 or 2; $Q^1$ represents, when k is 1, a single bond —O—, —S—, —COO—, or —NH—, and when k is 2, a trivalent N; $Q^2$ is —O— or —S—; i is 0 or an integer from 1 to 3; and j is an integer from 1 to 3, provided that i+j is 1 to 4.

(97)

wherein $Q^3$ represents —O—, —COO—, or —CO—; $R^{16}$ and $R^{17}$, which may be the same or different, represent a hydrogen atom or an alkyl group having 1–4 carbon atoms; and $R^{18}$ represents an alkyl group having 1–5 carbon atoms, an aryl group having 6–12 carbon atoms, or an aralkyl group having 7–14 carbon atoms; and y is an integer of 1 or more.

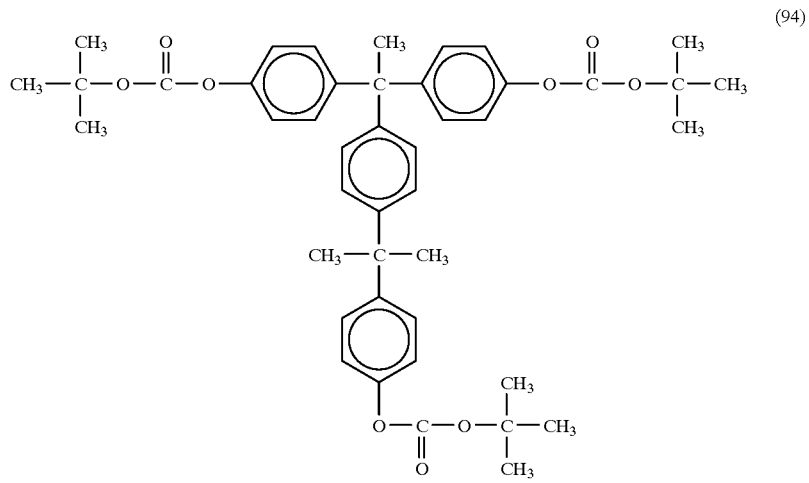
(94)

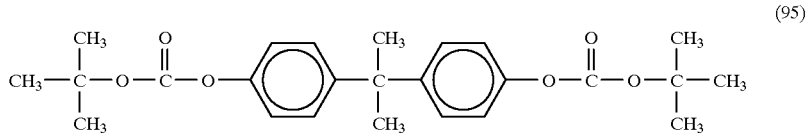
(95)

In the first invention, the low molecular compounds and the high molecular compounds may be used either individually or in combinations of two or more as the alkali-solubility control agent. A combination of low molecular compounds and high molecular compounds is acceptable.

(98)

wherein $R^{19}$, $R^{20}$ and $R^{21}$, which may be the same or different, represent a hydrogen atom or an alkyl group having 1–4 carbon atoms.

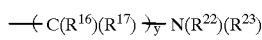

(99)

wherein $R^{16}$ and $R^{17}$ have the same meaning as defined in the formula (97); $R^{22}$ and $R^{23}$, which may be the same or different, represent an alkylol having 1–5 carbon atoms; and y is 0 or an integer of 1 or more.

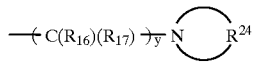

100 wherein $R^{16}$ and $R^{17}$ have the same meanings as defined in the formula (97); $R^{24}$ is a divalent organic group which can form tri- to octa-cyclic structure containing a hetero atom selected from oxygen, sulfur, and nitrogen.

Given as specific examples of these crosslinkable substituents are a glycidyl ether group, glycidyl ester group, glycidyl amino group, methoxymethyl group, ethoxymethyl group, benzyloxymethyl group, diethylaminomethyl group, dimethylaminomethyl group, dimethylolaminomethyl group, diethylolaminomethyl group, morpholinomethyl group, acetoxymethyl group, benzoyloxymethyl group, formyl group, acetyl group, vinyl group, and isopropenyl group.

Specific examples of the compounds having these crosslinkable substituents are epoxy compounds of bisphenol A, epoxy compounds of bisphenol F, epoxy compounds of bisphenol S, novolak resin-type epoxy compounds, resol resin-type epoxy compounds, poly(hydroxystyrene)-type epoxy compounds, methylol group-containing melamine compounds, methylol group-containing benzoguanamine compounds, methylol group-containing urea compounds, methylol group-containing phenol compounds, alkoxyalkyl group-containing melamine compounds, alkoxyalkyl group-containing benzoguanamine compounds, alkoxyalkyl group-containing urea compounds, alkoxyalkyl group-containing phenol compounds, carboxymethyl group-containing melamine resins, carboxymethyl group-containing benzoguanamine resins, carboxymethyl group-containing urea resins, carboxymethyl group-containing phenol resins, carboxymethyl group-containing melamine compounds, carboxymethyl group-containing benzoguanamine compounds, carboxymethyl group-containing urea compounds, and carboxymethyl group-containing phenol compounds.

Among these, methylol group-containing phenol compounds, methoxymethyl group-containing melamine compounds, methoxymethyl group-containing phenol compounds, methoxymethyl group-containing glycoloyl compounds, methoxymethyl group-containing urea compounds, and acetoxymethyl group-containing phenol compounds are particularly preferred, with ideal compounds being methoxymethyl group-containing melamine compounds (e.g. hexamethoxymethyl melamine), methoxymethyl group-containing glycoloyl compounds, and methoxymethyl group-containing urea compounds. The methoxymethyl group-containing melamine compounds are commercially available under the trademarks CYMEL 300, CYMEL301, CYMEL303, and CYMEL305 (manufactured by Mitsui Cyanamid Co.); the methoxymethyl group-containing glycoloyl compounds, under the trademark CYMEL1174 (manufactured by Mitsui Cyanamid Co.); and the methoxymethyl group-containing urea compounds, under the trademark MX290 (manufactured by Sanwa Chemical Co., Ltd.).

Further, alkali-soluble resins afforded with crosslinking characteristics by introducing one of the crosslinkable substituents to acidic functional group thereof are suitably used as the crosslinking agents. Although the proportion of crosslinkable substituents introduced to the alkali-soluble resin varies according to the kinds of alkali-soluble resin, such a proportion is normally 5–60 mol %, preferably 10–50 mol %, and more preferably 15–40 mol %. If this proportion is less than 5 mol %, it is difficult to effect a satisfactory crosslinking reaction, resulting in reduction in the rate of residual coatings and inducing winding or swelling of patterns; if more than 60 mol %, developing performances tend to be impaired.

As crosslinking agents used in the second invention, methoxymethyl group-containing compounds, such as dimethoxmethyl urea and tetramethoxymethyl glycoloyl, are preferred.

These crosslinking agents can be used either individually or in combinations of two or more in the second invention.

Although the proportions of the components which make up the positive-tone radiation sensitive resin composition of the first invention and negative-tone radiation sensitive resin composition of the second invention vary according to the characteristics desired of the resists, preferred proportions are as follows.

First, the proportion of the acid generating agent (A) in the first invention is usually 0.001–70 parts by weight, preferably 0.01–50 parts by weight, and particularly preferably 0.1–20 parts by weight, per 100 parts by weight of the acid decomposable group-containing resin or the alkali-soluble resin. The photographic sensitivity and resolution tend to decrease if this proportion of the acid generator (A) is less than 0.001 part by weight; if more than 70 parts by weight, on the other hand, coatability of resists and configuration of patterns tend to deteriorate.

The proportion of the alkali-solubility controlling agent is usually 5–150 parts by weight, preferably 5–100 parts by weight, and particularly preferably 5–50 parts by weight, per 100 parts by weight of the alkali-soluble resin. If the amount of the alkali-solubility controlling agent is less than 5 parts by weight, the rate of residual coatings tends to decrease and swelling of patterns tend to be produced; if more than 150 parts by weight, coating surface may be roughened and coating strength tends to decrease.

Specific proportions of each component in the first invention are:

[1—1] Acid generator (A): 0.001–70 parts by weight, acid-decomposable group-containing resin: 100 parts by weight, or

[1-2] Acid generator (A): 0.001–70 parts by weight, alkali-soluble resin: 100 parts by weight, alkali-solubility controlling agent: 5–150 parts by weight, more preferably,

[1-3] Acid generator (A): 0.01–50 parts by weight, acid-decomposable group-containing resin: 100 parts by weight, or

[1-4] Acid generator (A): 0.01–50 parts by weight, alkali-soluble resin: 100 parts by weight, alkali-solubility controlling agent: 5–100 parts by weight, and particularly preferably,

[1-5] Acid generator (A): 0.1–20 parts by weight, acid-decomposable group-containing resin: 100 parts by weights, or

[1-6] Acid generator (A): 0.1–20 parts by weight, alkali-soluble resin: 100 parts by weight, alkali-solubility controlling agent: 5–50 parts by weight.

Next, in the second invention, the proportion of the acid generator (A) is usually 0.001–70 parts by weight, preferably 0.01–50 parts by weight, particularly preferably 0.1–20 parts by weight, per 100 parts by weight of the alkali-soluble resin. The sensitivity and resolution tend to decrease if this amount of the acid generator (A) is less than 0.001 part by weight. If more than 70 parts by weight, coatability of resists and configuration of patterns tend to deteriorate. The proportion of the crosslinking agent is usually 5–95 parts by weight, preferably 15–85 parts by weight, and particularly preferably 20–75 parts by weight, per 100 parts by weight of alkali-soluble resin. The proportion of crosslinking agent less than 5 parts by weight may result in reduction in the rate of residual coatings and induce winding or swelling of patterns; the proportion exceeding 95 parts by weight tends to impair developing performances.

Specific proportions of each component in the first invention are:

[2-1] Acid generator (A): 0.001–70 parts by weight, alkali-soluble resin: 100 parts by weight, and crosslinking agent: 5–95 parts by weight, more preferably,

[2—2] Acid generator (A): 0.01–50 parts by weight, alkali-soluble resin: 100 parts by weight, and crosslinking agent: 15–85 parts by weight, and particularly preferably,

[2-3] Acid generator (A): 0.1–20 parts by weight, alkali-soluble resin: 100 parts by weight, and crosslinking agent: 20–75 parts by weight.

Besides the above-described essential components, the positive-tone radiation sensitive resin composition of the first invention and negative-tone radiation sensitive resin composition of the second invention may optionally be formulated with other components, such as a photoacid generator other than the above-described photoacid generator (A) (hereinafter referred to as "other photoacid generator"), acid diffusion control agent, surfactant, and photosensitizer. Moreover, it is possible to add the above-described alkali-soluble resins and/or alkali-solubility controlling agents to the positive-tone radiation sensitive resin composition of the first invention, in addition to the photoacid generator (A) and acid decomposable group-containing resin.

Onium salt compounds are preferable compounds as the other acid generators. Particularly preferable examples include diphenyliodonium trifluoromethane sulfonate, diphenyliodonium camphor sulfonate, bis(4-t-butylphenyl) iodonium trifluoromethane sulfonate, bis(4-t-bitylphenyl) iodonium camphor sulfonate, triphenylsulfonium trifluoromethane sulfonate, triphenylsulfonium camphor sulfonate, and triphenylsulfonium nonafluorobutane sulfonate. Beside these, other photoacid generators, such as halogen-containing compounds, sulfonate compounds, quinineazide compounds, sulfoneimode compounds, diazomethane compounds, can also be used.

These other photoacid generators may be used either individually or in combinations of two or more.

Although the amount of these other photoacid generators used is suitably selected according to the kinds of each photoacid generator, an amount 20 parts by weight or less, particularly preferably 15 parts by weight or less, per 100 parts by weight of the acid decomposable group-containing resin or alkali-soluble resin resin is applicable. If the amount of the other photoacid generators is more than 20 parts by weight, the resin composition may not be coated evenly or may produce scum during development.

The acid diffusion control agent controls diffusion of acid produced from the disulfonylmethane derivative (A) or the other acid generator by exposure to light in the resist film, thereby preventing undesired chemical reactions from occurring in the unexposed area of the resist. The use of the acid diffusion control agent prevents production of defects on the surface of patterns and improves precision patterns to the mask dimensions.

As such an acid diffusion control agent, a nitrogen compound which continues to be basic even after exposure to light during the process of forming resist patterns and heating thereafter is particularly desirable.

Given as specific examples of such nitrogen compounds are ammonia, trimethylamine, triethylamine, tripropylamine, tributyl amine, tripentylamine, trihexylamine, triheptylamine, trioctylamine, aniline, N-methylaniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pyrolidone, piperidine, imidazole, 4-methylimidazole, 4-methyl-2-phenylimidazole, benzimidazole, thiabendazole, pyridine, 2-methylpyridine, 4-ethylpyridine, 2-phenylpyridine, 4-phenylpyridine, 1-methyl-4-phenylpyridine, 2-(1-ethylpropyl) pyridine, 2-pentylpyridine, nicotinic acid amide, dibenzoylthiamine, ribophramine tetrabutyrate, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl) propane, 2-(4-aminophenyl)-2-(3-hydroxyphenyl)propane, 2-(4-aminophenyl)-2-(4-hydroxyphenol)propane, 1,4-bis[1-(4-aminophenyl)-1-methylethyl]benzene, and 1,3-bis [1-(4-aminophenyl)-1-methylethyl]benzene.

Of these acid diffusion control agents, especially preferred are tributylamine, tripentylamine, trihexylamine, triheptylamine, trioctylamine, N,N-dimethylaniline, benzimidazole, 4-phenylpyridine, 4,4'-diaminodiphenylether, and nicotinic acid amide.

These acid diffusion control agents may be used either individually or in combinations of two or more.

The amount of these acid diffusion control agents used in the compositions of the present invention varies according to the kind, the combinations with the disulfonylmethane derivatives (A) and/or photoacid generators, and the like. Usually, 5 parts by weight or less, preferably 10 parts by weight or less, for 100 parts by weight of the resin components in total in the resin composition is applicable. If the amount of acid diffusion control agents exceeds 10 parts by weight, sensitivity and developing performances of the exposed parts tend to decrease.

Surface active agents improve coatability and promote developing performances of the radiation sensitive resin composition. Anionic, cationic, nonionic, or amphoteric surfactants can be used, with particularly desirable surfactants being nonionic surfactants. Given as examples of nonionic surfactants are polyoxyethylene higher-alkyl ethers, polyoxyethylene higher-alkyl phenyl ethers, polyoxyethylene glycol higher-fatty acid diesters, and products commercially available under the trademarks, such as KP™ (manufactured by Sin-Etsu Chemical Co., Ltd.), Polyflows™ (manufacturedby Kyoei Oil and Fat Chemical Co., Ltd.), Efftops™ (manufactured by Tokem Products), Megafacks™ (manufactured by Dainippon Ink and Chemicals Co., Ltd.), Florades™ (manufactured by Sumitomo 3M Co., Ltd.), Asahi Guard™ and Surflon™ (manufactured by Asahi Glass Co., Ltd.).

These surfactants may be used either individually or in combinations of two or more.

The amount of the surfactants to be incorporated is normally less than 2 parts by weight for 100 parts by weight of the resin composition.

The sensitizers absorb irradiated energy and transfer the absorbed energy to disulfonylmethane derivatives (A) and/or photoacid generators, thereby accelerating production of an acid. Thus, the sensitizers have the effect of increasing the sensitivity of radiation sensitive resin composition. Preferable examples of such sensitizers are acetophenones, benzophenoenes, naphthalenes, biacetyls, Eosine, Rosebengal, pyrenes, anthracenes, and phenothiazines.

The amount of the sensitizers to be incorporated is normally 50 parts by weight or less, preferably 30 parts by weight or less, for 100 parts by weight of the resin composition.

Further, dyes or pigments may be incorporated for making potential images on the exposed area visible and alleviating effects of halations during irradiation, and adhesion promoters may be added to improve adhesion properties of the resist coating to substrates.

Furthermore, other additives, such as halation inhibitors, preservatives, defoaming agents, shape improvers, and the like may be added to the resin composition of the present invention. A typical specific example is 4-hydroxy-4'-methyl chalcone.

The positive-tone radiation sensitive resin composition of the first invention and the negative-tone radiation sensitive resin composition of the second invention are prepared in solution when used, by dissolving these in a solvent to make a solid concentration of 5–50 wt %, and filtering through a filter with a pore size of 0.2 μm, for example.

Ethers, esters, ether esters, ketones, ketone esters, amides, amide esters, lactams, lactones, and (halogenated) hydrocarbons are given as the solvents which can be used here. Specific examples are ethylene glycol monoalkyl ethers, diethylene glycol dialkyl ethers, propylene glycol monoalkyl ethers, propylene glycol alkyl ethers, acetates, hydroxy acetates, lactates, ethylene glycol monoalkyl ether acetates, propylene glycol monoalkyl ether acetates, alkoxy acetates, (ali)cyclic ketones, acetoacetic esters, pyruvic acid esters, propionic acid esters, N,N-dialkyl formamides, N,N-dialkyl acetamides, N-alkylpyrolidones, γ-lactones, (halogenated) aliphatic hydrocarbons, and (halogenated) aromatic hydrocarbons.

More specifically, such solvents include ethylene glycol monomethyl ether, ethylene glycol monoethyl ether, ethylene glycol monopropyl ether, ethylene glycol monobutyl ether, diethylene glycol dimethyl ether, diethylene glycol diethyl ether, diethylene glycol dipropyl ether, diethylene glycol dibutyl ether, methyl cellosolve acetate, ethyl cellosolve acetate, propylene glycol monomethyl ether acetate, propylene glycol monoethyl ether acetate, propylene glycol monopropyl ether acetate, isopropenyl acetate, isopropenyl propionate, toluene, xylene, methyl ethyl ketone, cyclohexanone, 2-heptanone, 3-heptanone, 4-heptanone, ethyl 2-hydroxy propionate, ethyl 2-hydroxy-2-methyl propionate, ethoxyethyl acetate, hydroxyethyl acetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, propyl acetate, butyl acetate, methyl acetoacetate, ethyl acetoacetate, methyl 3-methoxy propionate, ethyl 3-methoxypropionate, methyl 3-ethoxy propionate, ethyl 3-ethoxy propionate, N-methyl pyrolidone, N,N-dimethyl formamide, and N,N-dimethyl acetamide Of these solvents, 2-hydroxypropionic acid esters, 3-alkoxypropionic acid esters, propylene glycol monoalkyl ether acetates, and the like are particularly desirable.

These solvents may be used either individually or in combinations of two or more.

In addition to these solvents, one or more high boiling point solvents, such as, for example, benzyl ethyl ether, dihexyl ether, diethylene glycol monomethyl ether, diethylene glycol monoethyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate, may be added.

To prepare a resist pattern from the positive-tone radiation sensitive resin composition of the first invention or a negative-tone radiation sensitive resin composition of the second invention, the solution of the composition thus prepared is applied to a substrate such as a silicon wafer, aluminum-coated silicon wafer, to form a resist coating by rotational coating, cast coating, or roll coating. The resist coating is then heat treated (hereinafter called pre-bake "PB"), and irradiated to form a desired pattern through a mask pattern. Radiation used here is preferably deep ultraviolet rays such as a bright line spectrum from a mercury lamp (wavelength: 254 nm), KrF excimer laser (wavelength: 248 nm), and ArF excimer laser (wavelength: 193 nm). X-rays such as synchrotron radiation or charged particle rays such as an electron beam may also be used according to the kind of the disulfonylmethane derivative (A) or the other photoacid generators. Irradiation conditions such as the exposure dose of irradiation are appropriately determined according to the kind of the resin composition, the kind of additives, and the like.

After exposure to radiation, the coatings are preferably heated (hereinafter called post-exposure bake "PEB") to increase the sensitivity of the resist. Although the heating conditions are varied according to the types of the resin composition and the kinds of additives used, the resist is usually heated at 30–200° C., preferably 50–150° C. Then, the resist coating is developed with an alkaline developer for forming a prescribed pattern. An alkaline solution in which one or more alkaline compound is dissolved to a concentration of 1–10% by weight, preferably 2–5% by weight, is used as the alkaline developer. Given as examples of alkaline compounds which can be used here are alkali metal hydroxides, ammonia water, alkyl amines, alkanol amines, heterocyclic amines, tetra-alkylammonium hydroxide, cholines, 1,8-diazabicyclo-[5.4.0]-7-undecene, and 1,5-diazabicyclo-[4.3.0]-5-nonene. A particularly preferred alkaline developing solution is an aqueous solution of tetra-alkylammonium hydroxide.

Further, suitable amounts of water-soluble organic solvents, such as methanol and ethanol, and surfactants may be added to the developer.

The developed products are normally washed with water after development using these alkaline developers.

Japanese Patent Application no. 206360/1996 filed on Jul. 18, 1996 and Japanese Patent Application No. 105403/1997 filed on Apr. 9, 1998 are hereby incorporated by reference.

Other features of the invention will become apparent in the course of the following description of the exemplary embodiments which are given for illustration of the invention and are not intended to be limiting thereof.

EXAMPLES

Evaluation of resists was carried out for the following items.
Solubility:

Solubility of photoacid activators (A) or the other photoacid generators was observed by the naked eye when the sample in an amount of 10 wt % was dissolved in a solvent. A completely soluble sample was designated as "soluble" and a sample leaving insoluble residue was designated as, "insoluble".

Sensitivity:

A resist coating formed on a silicon wafer was exposed to light at various exposure doses. After exposure, the sample was immediately baked, developed using an alkali developer, washed with water, and dried, thereby producing a resist pattern. The optimum exposure sensitivity was determined taking the irradiation dose required for forming a pair of line-and-space patterns (1L1S) with a line width of 0.26 μm an optimum dose.

Resolution:

The minimum size (μm) of resist pattern produced when exposed to light with an optimum exposure dose was taken as the resolution.

Pattern Configuration:

The dimensions of the lower side (La) and upper side (Lb) of the square cross section of the 1L1S with a line width of 0.26 μm formed on a silicon wafer were measured using a scanning type electron microscope. Those satisfying an inequality, $0.85 \leq Lb/La \leq 1$, and having an upper layer pattern with a rectangular configuration were judged to be "Good" and those failing to satisfy either condition were judged to be "Bad".

Rate of Residual Coating:

The ratio (%) of resist coating thickness exposed to light at an optimum dose before development of the resist pattern to the thickness after development was taken as the rate of residual coating.

The components used in the following examples and comparative examples were as follows.

[1] Positive-tone Radiation Sensitive Resin Composition

Disulfonylmethane Derivatives (A)

(A-1) Bis(phenylsulfonyl)-3-cyclopentene (formula (3))
(A-2) Bis(phenylsulfonyl)-2,4-cyclopentadiene (formula (4))
(A-3) Bis(phenylsulfonyl)-2,4-cyclohexadiene (formula (5))
(A-4) 1-Phenyl-1,1-bis(phenylsulfonyl)ethane (formula (14))
(A-5) Bis(phenylsulfonyl)-1-naphthylmethanol (formula (25))
(A-6) Bis(phenylsulfonyl)-diphenylmethane (formula (34))
(A-7) Bis(cyclohexylsulfonyl)fluorene (formula (40))
(A-8) 1-(1-Naphthyl)-1,1-bis(cyclohexylsulfonyl)ethane (formula (48))
(A-9) Bis(cyclohexylsulfonyl)-4-nitrophenylmethanol (formula (59))
(A-10) Bis(4-trifluoromethylphenylsulfonyl)-2,4-cyclohexadiene (formula (70))
(A-11) 1-Phenyl-[1,1-bis(4-trifluoromethylphenylsulfonyl)]ethane (formula (76))
(A-12) Bis(cyclohexylsulfonyl)-diphenylmethane (formula (67))
(A-13) Bisphenylsulfonyl-cyclobutane (formula (101))
(A-14) Bisphenylsulfonyl-cyclopentane (formula (102))
(A-15) Bisphenylsulfonyl-cyclohexane (formula (103))

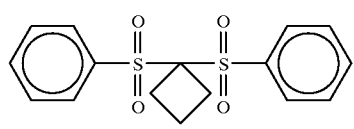

(101)

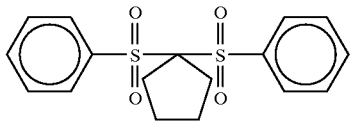

(102)

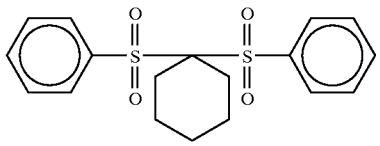

(103)

Other Acid Generators:
(α-1) Triphenylsulfoniumtrifluoromethane sulfonate
(α-2) Bis(cyclohexylsulfonyl)diazomethane
(α-3) Bis(cyclohexylsulfonyl)methane
(α-4) Bis(cyclohexylsulfonyl)cyclobutane
(α-5) Triphenylsulfoniumtrifluoromethane sulfonate
(α-6) Diphenyliodoniumtrifluoromethane sulfonate
(α-7) Diphenyliodoniumcamphor sulfonate Acid-decomposable Group Containing Resin (B-1) Poly(hydroxystyrene) resin in which 26 mol % of hydrogen atoms on a phenolic hydroxyl group was replaced by a t-butoxy carbonyl group (Mw=9,000)
(B-2) Poly(hydroxystyrene) resin in which 20 mol % of hydrogen atoms on a phenolic hydroxyl group was replaced by a t-butoxy carbonyl methyl group (Mw=25,000)
(B-3) Poly(hydroxystyrene) resin in which 32 mol % of hydrogen atoms on a phenolic hydroxyl group was replaced by a 1-ethoxyethyl group (Mw=15,000)
(B-4) Copolymer of hydroxy-α-methyl styrene and t-butyl acrylate (copolymerization molar ratio=5:5, Mw=12,000)

Alkali-soluble Resin (B-5) Poly(p-hydroxystyrene) (Mw=7,500)

Alkali-solubility Controlling Agents (b-1) Compound with the above formula (94)
(b-2) Compound with the above formula (95)

Other Components

Acid Diffusion Control Agents:
 Tributyl amine (β-1)
 Nicotinic acid amide (β-2)
 Benzimidazole (β3)

Solvents:
 Ethyl 2-hydroxypropionate (γ-1)
 Propylene glycol methyl ether acetate (γ-2)

[II] Negative-tone Radiation Sensitive Resin Compositions

Disulfonylmethane Derivatives (A)

The same compounds used for [I] positive-tone radiation sensitive resin composition was used.

Other Acid Generators

The same compounds used for [I] positive-tone radiation sensitive resin composition was used.

Alkali-soluble Resins (C-1) Poly(p-hydroxystyrene) (MW=7,500)
(C-2) Copolymer of p-hydroxystyrene and styrene (copolymerization molar ratio=8:2, Mw=4,000)

Crosslinking Agents (D-1) Dimethoxymethylurea (MX290™, manufactured by Sanwa Chemical Co., Ltd.)
(D-2) Tetramethoxymethyl glycoloyl (CYMEL 1174™ manufactured by Mitsui Cyanamid Co.)

The Other Components

The same compounds used for [I] positive-tone radiation sensitive resin composition was used.

Examples 1–92, Comparative Examples 1–8

Table 1 shows the evaluation results for solubility of disulfonylmethane derivatives (A) and photoacid generators in the solvents used for dissolving the compositions.

Components listed in Table 2 (positive-tone radiation sensitive resin composition) and Table 4 (negative-tone radiation sensitive resin composition) in parts by weight were mixed to produce homogeneous solutions. The solutions were then filtered through a membrane filter with a pore diameter of 0.2 μm to prepare composition solutions.

Each composition solution was applied to a silicon wafer by rotational coating, followed by PB (pre-baking) at a temperature for a period of time as shown in Table 3 and Table 5 to obtain a resist coating with a thickness of 1.0 μm. This resist coating was exposed to an excimer laser at a wavelength of 248 nm while changing the irradiation dose through a mask pattern using a KrF excimer laser-irradiation apparatus (NSR-2005 8X8A™ manufactured by Nicon Co., Ltd.), following which PEB (post exposure baking) was carried out at a temperature for a period of time as shown in Table 3 and Table 5. The resist was then developed using an aqueous solution of 2.38 wt % tetramethyl ammonium hydroxide as a developing solution for 60 seconds at 23° C., washed with water for 30 seconds, and dried to form a resist pattern. The results of evaluation of each Example and Comparative Example are shown in Table 3 (positive-tone radiation sensitive resin composition) and Table 5 (negative-tone radiation sensitive resin composition).

TABLE 1

| | Photoacid generator | Solvent γ-1 | Solvent γ-2 |
|---|---|---|---|
| Example 1 | A-1 | Soluble | Soluble |
| Example 2 | A-2 | Soluble | Soluble |
| Example 3 | A-3 | Soluble | Soluble |
| Example 4 | A-4 | Soluble | Soluble |
| Example 5 | A-5 | Soluble | Soluble |
| Example 6 | A-6 | Soluble | Soluble |
| Example 7 | A-7 | Soluble | Soluble |
| Example 8 | A-8 | Soluble | Soluble |
| Example 9 | A-9 | Soluble | Soluble |
| Example 10 | A-10 | Soluble | Soluble |
| Example 11 | A-11 | Soluble | Soluble |
| Example 12 | A-12 | Soluble | Soluble |
| Example 13 | A-13 | Soluble | Soluble |
| Example 14 | A-14 | Soluble | Soluble |
| Example 15 | A-15 | Soluble | Soluble |
| Comparative Example 1 | α1 | Soluble | Scarcely soluble |
| Comparative Example 2 | α5 | Scarcely soluble | Scarcely soluble |

TABLE 2-1

(Positive-tone radiation sensitive resin composition)

(part by weight)

| | Alkali-soluble resin/acid-decomposable group containing resin | Photoacid generator | Acid diffusion control agent | Solvent |
|---|---|---|---|---|
| Example 16 | B-1(100) | A-1(3) | β-1(1) | γ-1(400) |
| Example 17 | B-2(100) | A-1(3) | β-1(1) | γ-1(400) |
| Example 18 | B-3(100) | A-1(3) | β-1(1) | γ-2(400) |
| Example 19 | B-3(50) + B-5(50) | A-1(3) | β-1(1) | γ-1(400) |
| Example 20 | B-1(70) + B-3(30) | A-1(3) | β-1(1) | γ-2(400) |
| Example 21 | B-4(80) + B-3(20) | A-1(3) | β-1(1) | γ-2(400) |
| Example 22 | B-5(70) + B-1(30) | A-1(3) | β-1(1) | γ-2(400) |
| Example 23 | B-5(70) + B-2(30) | A-1(3) | β-1(1) | γ-2(400) |
| Example 24 | B-3(100) | A-1(3) | β-1(1) | γ-2(400) |
| Example 25 | B-3(100) | A-1(3) | β-1(1) | γ-2(400) |
| Example 26 | B-3(100) | A-1(3) | β-1(1) | γ-2(400) |
| Example 27 | B-3(100) | A-1(3) | β-1(1) | γ-2(400) |
| Example 28 | B-3(100) | A-3(3) | β-1(1) | γ-2(400) |
| Example 26 | B-3(100) | A-4(3) | β-1(1) | γ-2(400) |
| Example 27 | B-3(100) | A-5(3) | β-1(1) | γ-2(400) |
| Example 28 | B-3(100) | A-6(3) | β-1(1) | γ-2(400) |
| Example 29 | B-3(100) | A-7(3) | β-1(1) | γ-2(400) |
| Example 30 | B-3(100) | A-8(3) | β-1(1) | γ-2(400) |
| Example 31 | B-3(100) | A-9(3) | β-1(1) | γ-2(400) |
| Example 32 | B-3(100) | A-10(3) | β-1(1) | γ-2(400) |
| Example 33 | B-3(100) | A-11(3) | β-1(1) | γ-2(400) |
| Example 34 | B-3(100) | A-12(5) | β-2(1) | γ-2(400) |
| Example 35 | B-3(100) | A-12(3) | β-1(1) | γ-2(400) |
| Example 36 | B-3(400) | A-7(3) | β-2(1) | γ-2(400) |
| Example 37 | B-3(100) | A-12(5) | β-3(1) | γ-2(400) |
| Example 38 | B-1(100) | A-13(4) | β-1(1) | γ-1(400) |
| Example 39 | B-2(100) | A-13(4) | β-1(1) | γ-1(400) |

TABLE 2-2

(Positive-tone radiation sensitive resin composition)

(part by weight)

| | Alkali-soluble resin/acid-decomposable group containing resin | Photoacid generator | Acid diffusion control agent | Solvent |
|---|---|---|---|---|
| Example 40 | B-3(100) | A-13(4) | β-1(1) | γ-2(400) |
| Example 41 | B-4(50) + B-5(50) | A-13(4) | β-1(1) | γ-1(400) |
| Example 42 | B-1(100) | A-14(4) | β-1(1) | γ-1(400) |
| Example 43 | B-2(100) | A-14(4) | β-1(1) | γ-1(400) |
| Example 44 | B-3(100) | A-14(4) | β-1(1) | γ-2(400) |
| Example 45 | B-4(50) + B-5(50) | A-14(4) | β-1(1) | γ-1(400) |
| Example 46 | B-1(100) | A-14(4) | β-1(1) | γ-1(400) |
| Example 47 | B-2(100) | A-15(4) | β-1(1) | γ-1(400) |
| Example 48 | B-3(100) | A-15(4) | β-1(1) | γ-1(400) |
| Example 49 | B-4(50) + B-5(50) | A-15(4) | β-1(1) | γ-1(400) |
| Example 50 | B-1(70) + B-3(30) | A-15(4) | β-1(1) | γ-1(400) |
| Example 51 | B-3(80) + B-4(20) | A-15(4) | β-1(1) | γ-2(400) |
| Example 52 | B-5(70) + B-1(30) | A-15(3) | β-1(1) | γ-1(400) |
| Example 53 | B-5(70) + B-2(30) | A-15(3) | β-1(1) | γ-1(400) |
| Example 54 | B-3(80) + B-4(20) | A-14(2) + A-15(2) | β-1(1) | γ-2(400) |
| Example 55 | A-3(80) + B-4(20) | A-15(3) + α-1(1) | β-1(1) | γ-2(400) |

TABLE 2-2-continued (Positive-tone radiation sensitive resin composition)

(part by weight)

| | Alkali-soluble resin/acid-decomposable group containing resin | Photoacid generator | Acid diffusion control agent | Solvent |
|---|---|---|---|---|
| Example 56 | B-3(80) + B-4(20) | A-15(3) + α-5(1) | β-1(1) | γ-2(400) |
| Example 57 | B-3(80) + B-4(20) | A-15(3) + α-6(1) | β-1(1) | γ-2(400) |
| Example 58 | B-3(80) + B-4(20) | A-15(4) | β-2(1) | γ-2(400) |
| Example 59 | B-3(80) + B-4(20) | A-15(4) | β-3(1) | γ-2(400) |
| Comparative Example 1 | B-3(100) | α-2(3) | β-1(1) | γ-2(400) |
| Comparative Example 2 | B-3(100) | α-3(3) | β-1(1) | γ-2(400) |
| Comparative Example 3 | B-3(100) | α-4(3) | β-1(1) | γ-2(400) |

TABLE 3-1

(Positive-tone radiation sensitive resin composition)

| Example | PB (° C./sec) | PEB (° C./sec) | Sensitivity (mJ/cm$^2$) | Resolution (mm) | Pattern configuration | Rate of residual coating (%) |
|---|---|---|---|---|---|---|
| 16 | 90/90 | 110/90 | 60 | 0.24 | Good | 97 |
| 17 | 90/90 | 110/90 | 65 | 0.24 | Good | 96 |
| 18 | 90/90 | 110/90 | 55 | 0.24 | Good | 94 |
| 19 | 90/90 | 110/90 | 65 | 0.24 | Good | 97 |
| 20 | 90/90 | 110/90 | 60 | 0.24 | Good | 95 |
| 21 | 90/90 | 110/90 | 60 | 0.24 | Good | 95 |
| 22 | 90/90 | 110/90 | 50 | 0.24 | Good | 95 |
| 23 | 90/90 | 110/90 | 50 | 0.24 | Good | 95 |
| 24 | 90/90 | 110/90 | 46 | 0.24 | Good | 95 |
| 25 | 90/90 | 110/90 | 47 | 0.24 | Good | 95 |
| 26 | 90/90 | 110/90 | 42 | 0.24 | Good | 95 |
| 27 | 90/90 | 110/90 | 38 | 0.24 | Good | 95 |
| 28 | 90/90 | 110/90 | 66 | 0.22 | Good | 96 |
| 29 | 90/90 | 110/90 | 40 | 0.24 | Good | 96 |
| 30 | 90/90 | 110/90 | 48 | 0.22 | Good | 96 |
| 31 | 90/90 | 110/90 | 52 | 0.22 | Good | 96 |
| 32 | 90/90 | 110/90 | 35 | 0.22 | Good | 96 |
| 33 | 90/90 | 110/90 | 30 | 0.22 | Good | 96 |
| 34 | 90/90 | 110/90 | 24 | 0.22 | Good | 96 |
| 35 | 90/90 | 110/90 | 45 | 0.22 | Good | 96 |
| 36 | 90/90 | 110/90 | 47 | 0.22 | Good | 96 |
| 37 | 96/90 | 110/90 | 42 | 0.22 | Good | 96 |
| 38 | 90/90 | 110/90 | 42 | 0.24 | Good | 95 |
| 39 | 90/90 | 110/90 | 32 | 0.24 | Good | 94 |

TABLE 3-2

(Positive-tone radiation sensitive resin composition)

| | PB (° C./sec) | PEB (° C./sec) | Sensitivity (mJ/cm$^2$) | Resolution (mm) | Pattern configuration | Rate of residual coating (%) |
|---|---|---|---|---|---|---|
| Example | | | | | | |
| 40 | 90/90 | 110/90 | 32 | 0.22 | Good | 95 |
| 41 | 140/90 | 140/90 | 30 | 0.24 | Good | 96 |
| 42 | 90/90 | 110/90 | 39 | 0.24 | Good | 95 |
| 43 | 90/90 | 110/90 | 29 | 0.24 | Good | 94 |
| 44 | 90/90 | 110/90 | 28 | 0.22 | Good | 95 |
| 45 | 140/90 | 140/90 | 28 | 0.24 | Good | 96 |
| 46 | 99/90 | 110/90 | 41 | 0.22 | Good | 95 |
| 47 | 90/90 | 110/90 | 32 | 0.22 | Good | 94 |
| 48 | 90/90 | 110/90 | 30 | 0.22 | Good | 95 |
| 49 | 140/90 | 140/90 | 30 | 0.22 | Good | 96 |
| 50 | 90/90 | 110/90 | 35 | 0.20 | Good | 96 |
| 51 | 90/90 | 110/90 | 30 | 0.20 | Good | 95 |
| 52 | 90/90 | 110/90 | 24 | 0.24 | Good | 93 |
| 53 | 90/90 | 110/90 | 23 | 0.24 | Good | 92 |
| 54 | 90/90 | 110/90 | 30 | 0.20 | Good | 96 |
| 55 | 90/90 | 110/90 | 24 | 0.20 | Good | 97 |
| 56 | 90/90 | 110/90 | 22 | 0.20 | Good | 97 |
| 57 | 90/90 | 110/90 | 25 | 0.20 | Good | 95 |
| 58 | 90/90 | 110/90 | 28 | 0.22 | Good | 96 |
| 59 | 90/90 | 110/90 | 26 | 0.22 | Good | 97 |
| Comparative Example | | | | | | |
| 3 | 90/90 | 110/90 | 105 | 0.22 | Good | 95 |
| 4 | 90/90 | 110/90 | Not Sensitized | — | — | — |
| 5 | 90/90 | 110/90 | 110 | 0.26 | Bad | 95 |

TABLE 4-1

(Negative-tone radiation sensitive resin composition)

(part by weight)

| Example | Alkali-soluble resin/acid-decomposable group containing resin | Photoacid generator | Cross-linking agent | Acid diffusion control agent | Solvent |
|---|---|---|---|---|---|
| 60 | C-1(100) | A-1(8) | D-1(7) | β-1(1) | γ-2(400) |
| 61 | C-2(100) | A-1(8) | D-1(7) | β-1(1) | γ-2(400) |
| 62 | C-1(50) + C-2(50) | A-1(8) | D-1(7) | β-1(1) | γ-2(400) |
| 63 | C-1(100) | A-1(8) | D-2(7) | β-1(1) | γ-2(400) |
| 64 | C-2(100) | A-1(8) | D-2(7) | β-1(1) | γ-2(400) |
| 65 | C-1(50) + C-2(50) | A-1(8) | D-2(7) | β-1(1) | γ-2(400) |
| 66 | C-1(50) + C-2(50) | A-2(8) | D-1(7) | β-1(1) | γ-2(400) |
| 67 | C-1(50) + C-2(50) | A-3(8) | D-1(7) | β-1(1) | γ-2(400) |
| 68 | C-1(50) + C-2(50) | A-4(8) | D-1(7) | β-1(1) | γ-2(400) |
| 69 | C-1(50) + C-2(50) | A-5(8) | D-1(7) | β-1(1) | γ-2(400) |
| 70 | C-1(50) + C-2(50) | A-6(8) | D-1(7) | β-1(1) | γ-2(400) |
| 71 | C-1(50) + C-2(50) | A-7(8) | D-1(7) | β-1(1) | γ-2(400) |
| 72 | C-1(50) + C-2(50) | A-7(12) | D-1(7) | β-1(1) | γ-2(400) |
| 73 | C-1(50) + C-2(59) | A-8(8) | D-1(7) | β-1(1) | γ-2(400) |
| 74 | C-1(50) + C-2(50) | A-9(8) | D-1(7) | β-1(1) | γ-2(400) |
| 75 | C-1(50) + C-2(50) | A-12(8) | D-1(7) | β-1(1) | γ-2(400) |
| 76 | C-1(50) + C-2(50) | A-9(8) | D-1(7) | β-1(1) | γ-2(400) |
| 77 | C-1(50) + C-2(50) | A-10(8) | D-1(7) | β-1(1) | γ-2(400) |
| 78 | C-1(50) + C-2(50) | A-12(8) | D-1(7) | β-2(1) | γ-2(400) |
| 79 | C-1(50) + C-2(50) | A-12(8) | D-1(7) | β-3(1) | γ-2(400) |
| 80 | C-1(100) | A-15(8) | D-1(7) | β-1(1) | γ-1(400) |

TABLE 4-2

(Negative-tone radiation sensitive resin composition)

(part by weight)

| | Alkali-soluble resin/acid-decomposable group containing resin | Photoacid generator | Cross-linking agent | Acid diffusion control agent | Solvent |
|---|---|---|---|---|---|
| Example | | | | | |

TABLE 4-2-continued (Negative-tone radiation sensitive resin composition)

(part by weight)

| | Alkali-soluble resin/acid-decomposable group containing resin | Photoacid generator | Cross-linking agent | Acid diffusion control agent | Solvent |
|---|---|---|---|---|---|
| 81 | C-2(100) | A-15(8) | D-1(7) | β-1(1) | γ-1(400) |
| 82 | C-1(30) + C-2(70) | A-15(8) | D-1(7) | β-1(1) | γ-1(400) |
| 83 | C-1(100) | A-15(8) | D-2(7) | β-1(1) | γ-1(400) |
| 84 | C-2(100) | A-15(8) | D-2(7) | β-1(1) | γ-1(400) |
| 85 | C-1(30) + C-2(70) | A-15(8) | D-2(7) | β-1(1) | γ-1(400) |
| 86 | C-1(30) + C-2(70) | A-15(6) + α-1(2) | D-2(7) | β-1(1) | γ-1(400) |
| 87 | C-1(30) + C-2(70) | A-15(6) + α-5(2) | D-2(7) | β-1(1) | γ-1(400) |
| 88 | C-1(30) + C-2(70) | A-15(6) + α-6(2) | D-2(7) | β-1(1) | γ-1(400) |
| 89 | C-1(30) + C-2(70) | A-15(8) | D-2(7) | β-2(1) | γ-1(400) |
| 90 | C-1(30) + C-2(70) | A-15(8) | D-2(7) | β-3(1) | γ-1(400) |
| 91 | C-1(30) + C-2(70) | A-13(8) | D-2(7) | β-1(1) | γ-1(400) |
| 92 | C-1(30) + C-2(70) | A-14(8) | D-2(7) | β-1(1) | γ-1(400) |
| Comparative Example | | | | | |
| 6 | C-1(50) + C-2(50) | α-2(8) | D-1(7) | β-1(1) | γ-2(400) |
| 7 | C-1(50) + C-2(50) | α-3(8) | D-1(7) | β-1(1) | γ-2(400) |
| 8 | C-1(50) + C-2(50) | α-4(8) | D-1(7) | β-1(1) | γ-2(400) |

TABLE 5-1

(Negative-tone radiation sensitive resin composition)

| Example | PB (°C./sec) | PEB (°C./sec) | Sensitivity (mJ/cm²) | Resolution (mm) | Pattern configuration |
|---|---|---|---|---|---|
| 60 | 90/90 | 110/90 | 40 | 0.24 | Good |
| 61 | 90/90 | 110/90 | 55 | 0.24 | Good |
| 62 | 90/90 | 110/90 | 48 | 0.24 | Good |
| 63 | 90/90 | 110/90 | 52 | 0.24 | Good |
| 64 | 90/90 | 110/90 | 60 | 0.24 | Good |
| 65 | 90/90 | 110/90 | 58 | 0.24 | Good |
| 66 | 90/90 | 110/90 | 40 | 0.24 | Good |
| 67 | 90/90 | 110/90 | 40 | 0.24 | Good |
| 68 | 90/90 | 110/90 | 34 | 0.24 | Good |
| 69 | 90/90 | 110/90 | 28 | 0.24 | Good |
| 70 | 90/90 | 110/90 | 25 | 0.24 | Good |
| 71 | 90/90 | 110/90 | 60 | 0.22 | Good |
| 72 | 90/90 | 110/90 | 52 | 0.22 | Good |
| 73 | 90/90 | 110/90 | 30 | 0.22 | Good |
| 74 | 90/90 | 110/90 | 40 | 0.22 | Good |
| 75 | 90/90 | 110/90 | 38 | 0.22 | Good |
| 76 | 90/90 | 110/90 | 23 | 0.22 | Good |
| 77 | 90/90 | 110/90 | 20 | 0.22 | Good |
| 78 | 90/90 | 110/90 | 40 | 0.22 | Good |
| 79 | 90/90 | 110/90 | 39 | 0.22 | Good |
| 80 | 90/90 | 110/90 | 30 | 0.22 | Good |

TABLE 5-2

(Negative-tone radiation sensitive resin composition)

| | PB (°C./sec) | PEB (°C./sec) | Sensitivity (mj/cm²) | Resolution (mm) | Pattern configuration |
|---|---|---|---|---|---|
| Example | | | | | |
| 81 | 90/90 | 110/90 | 35 | 0.22 | Good |
| 82 | 90/90 | 110/90 | 32 | 0.22 | Good |
| 83 | 90/90 | 110/90 | 33 | 0.22 | Good |
| 84 | 90/90 | 110/90 | 36 | 0.22 | Good |
| 85 | 90/90 | 110/90 | 34 | 0.20 | Good |
| 86 | 90/90 | 110/90 | 38 | 0.20 | Good |
| 87 | 90/90 | 110/90 | 40 | 0.20 | Good |
| 88 | 90/90 | 110/90 | 40 | 0.20 | Good |
| 89 | 90/90 | 110/90 | 35 | 0.20 | Good |
| 90 | 90/90 | 110/90 | 37 | 0.22 | Good |
| 91 | 90/90 | 110/90 | 39 | 0.22 | Good |
| 92 | 90/90 | 110/90 | 33 | 0.22 | Good |
| Comparative Example | | | | | |
| 6 | 90/90 | 110/90 | 90 | 0.22 | Good |
| 7 | 90/90 | 110/90 | Not sensitized | — | — |
| 8 | 90/90 | 110/90 | 106 | 0.26 | Bad |

Synthesis Example 1
<Synthesis of Bisphenylsulfonylmethane>

55 g (0.5 mol) of thiophenol was added drop-wise into a solution 31 g of (0.55 mol) of potassium hydroxide dissolved in 150 ml of methanol. Then, 25.5 g (0.3 mol) of methylene chloride was added drop-wise over one hour while stirring at 50–55° C., followed by stirring for three hours at the same temperature to effect the reaction. Then, acetic acid was added to the reaction solution at the same temperature to adjust the pH to 6–8. After the addition of a solution of one g of sodium tungstenate tri-hydrate in 6 ml of water, 165 g of 31 wt % hydrogen peroxide (about 1.6 mol as hydrogen peroxide) was added drop-wise into the reaction solution while adjusting the rate of dripping so as to prevent bumping. After the addition, the temperature of the reaction solution was raised to 65° C. and the mixture was stirred for a further three hours. Next, 200 ml of water was added drop-wise while stirring the reaction solution to cool to room temperature, whereupon the mixture was allowed to stand overnight. Deposited crystals were collected by filtration, washed with water, and dried to obtain 53 g of crude crystals. The crude crystals were then recrystallized from a mixed solvent of water, ethanol, and 1,4-dioxane, thereby yielding 41 g of white crystals of bisphenylsulfonyl methane.

The results of analysis of the bisphenylsulfonyl methane were as follows.

(1) Elemental analysis

| | Found (wt %) | Calculated (wt %) |
|---|---|---|
| Carbon | 52.5 | 52.7 |
| Hydrogen | 4.1 | 4.1 |
| Sulfur | 21.7 | 21.6 |
| Oxygen | 21.7 | 21.6 |

(2) Melting point: 121–123° C.
(3) Molecular weight of cation produced by bonding of a proton to the bisphenylsulfonyl methane molecule ([M+H]$^+$), measured by high speed atom collision mass spectrum (FAB-MS): 297
(4) $^1$H-NMR (CDCl3, δ)
    4.74 ppm (singlet by 2H in $SO_2$—$CH_2$—$SO_2$ bond), 7.42–7.78 ppm (multiplet by ortho- and para-6H of phenyl group), 7.87–8.02 ppm (multiplet by metha-4H of phenyl group)

Synthesis Example 2

<Synthesis of 1,1-bis(phenylsulfonyl)cyclobutane>

14.7 g (0.05 mol) of bisphenylsulfonyl methane was dissolved in 75 ml of methylene chloride, and 12.1 g (0.06 mol) of 1,3-dibromopropane and 30 ml of an aqueous solution of 5 g of (0.125 mol) sodium hydroxide were added to the solution. Then, the reaction solution was vigorously stirred at room temperature, followed by drop-wise addition of 15 ml of tetra-n-butyl ammonium fluoride solution in tetrahydrofuran (concentration: 1 mol/liter). After stirring overnight at room temperature, the mixture was filtered to collect the produced precipitate. The precipitate was washed with 15 ml of methylene chloride, filtrate and washings were transferred to a separating funnel, thoroughly shaken, and allowed to stand to separate an organic layer. This organic layer was washed with a 10 wt % aqueous solution of sodium chloride, dried over anhydrous sodium sulfate, concentrated by distillation, and dried under vacuum to obtain 11.9 g of crude crystals. The crude crystals were recrystallized from a mixed solvent of water, ethanol, and 1,4-dioxane to obtain 8.1 g of white crystals of 1,1-bis (phenylsulfonyl)cyclobutane.

The results of analysis of the 1,1-bis(phenylsulfonyl)-cyclobutane were as follows.

(1) Elemental analysis

|  | Found (wt %) | Calculated (wt %) |
| --- | --- | --- |
| Carbon | 56.8 | 57.1 |
| Hydrogen | 4.7 | 4.8 |
| Sulfur | 19.1 | 10.1 |
| Oxygen | 19.4 | 19.0 |

(2) Melting point: 119–121° C.
(3) ([M+H]$^+$): 337
(4) $^1$H-NMR (CDCl3, δ)

2.96 ppm (triplet by 4H in the cyclobutane structure of the following formula (104)), 2.13 ppm (quintet by 2H in the cyclobutane structure shown by the following formula (105)), 7.26–7.81 ppm (multiplet by ortho- and para-6H of a phenyl group), 7.92–8.09 ppm (multiplet by metha-4H of a phenyl group)

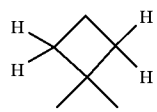

(104)

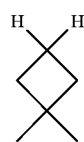

(105)

Synthesis Example 3

<Synthesis of 1,1-bis(phenylsulfonyl)cyclopentane>

White crystals (8.6 g) of 1,1-bis(phenylsulfonyl) cyclopentane were prepared in the same manner as the Synthesis Example 2, except for using 13 g (0.06 mol) of 1,4-dibromobutane instead of 12.1 g (0.06 mol) of 1,3-dibromopropane.

The results of analysis of the 1,1-bis (phenylsulfonyl)-cyclopentane were as follows.

(1) Elemental analysis

|  | Found (wt %) | Calculated (wt %) |
| --- | --- | --- |
| Carbon | 58.4 | 58.3 |
| Hydrogen | 5.1 | 5.2 |
| Sulfur | 18.3 | 18.3 |
| Oxygen | 18.2 | 18.3 |

(2) Melting point: 145–147° C.
(3) ([M+H]$^+$): 351
(4) $^1$H-NMR (CDCl$_3$, δ)

2.49 ppm (triplet by 4H in the cyclopentane structure of the following formula (106)), 1.77 ppm (quintet by 4H in the cyclopentane structure shown by the following formula (107)), 7.44–7.78 ppm (multiplet by ortho- and para-6H of a phenyl group), 7.99–8.13 ppm (multiplet by metha-4H of a phenyl group)

(106)

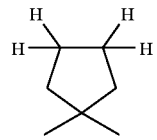

(107)

Synthesis Example 4

<Synthesis of 1,1-bis(phenylsulfonyl)cyclohexanle>

White crystals (7.8 g) of 1,1-bis(phenylsulfonyl) cyclohexane were prepared in the same manner as the Synthesis Example 2, except for using 13.8 g (0.05 mol) of 1,5-dibromopentane instead of 12.1 g (0.06 mol) of 1,3-dibromopropane.

The results of analysis of the 1,1-bis (phenylsulfonyl)-cyclohexane were as follows.

(1) Elemental analysis

|  | Found (wt %) | Calculated (wt %) |
| --- | --- | --- |
| Carbon | 59.5 | 59.3 |
| Hydrogen | 5.4 | 5.5 |
| Sulfur | 17.6 | 17.6 |
| Oxygen | 17.5 | 17.6 |

(2) Melting point: 169–171° C.
(3) ([M+H]$^+$): 365
(4) $^1$H-NMR (CDCl$_3$, δ)

2.31 ppm (triplet by 4H in the cyclohexane structure of the following formula (108)), 1.93 ppm (quintet by 4H in the cyclohexane structure shown by the following formula (109)), 1.36–1.73 ppm (multiplet by 2H in the cyclohexane structure shown by the following formula (110)), 7.43–7.82 ppm (multiplet by ortho- and para-6H of a phenyl group), 7.95–8.20 ppm (multiplet by metha-4H of a phenyl group)

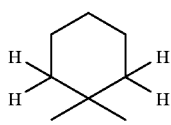

(108)

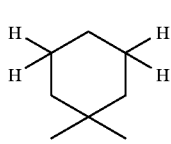

(109)

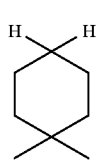

(110)

Synthesis Example 5
<Synthesis of 1,1-bis(phenylsulfonyl)cyclopentene>

White crystals (9.6 g) of 1,1-bis(phenylsulfonyl) cyclopentene were prepared in the same manner as the Synthesis Example 2, except for using 6.3 g (0.05 mol) of cis-1,4-dichlorobutan-2-ene instead of 12.1 g (0.06 mol) of 1,3-dibromopropane.

The results of analysis of the 1,1-bis(phenylsulfonyl)-cyclopentene were as follows.
(1) Elemental analysis

|  | Found (wt %) | Calculated (wt %) |
|---|---|---|
| Carbon | 58.6 | 58.6 |
| Hydrogen | 4.7 | 4.6 |
| Sulfur | 18.4 | 18.4 |
| Oxygen | 18.3 | 18.4 |

(2) Melting point: 174° C.
(3) ([M+H]$^+$): 349
(4) $^1$H-NMR (CDCl$_3$, δ)

3.35 ppm (triplet by 4H in the cyclopentene structure of the following formula (111)), 5.40 ppm (multiplet by 2H in the cyclopentene structure shown by the following formula (112)), 7.65–7.81 ppm (multiplet by ortho- and para-6H of a phenyl group), 8.01–8.12 ppm (multiplet by metha-4H of a phenyl group)

(111)

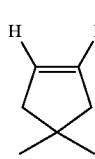

(112)

Synthesis Example 6
<Synthesis of bis(phenylsulfonyl)-diphenylmethane>

White crystals (56 g) of bis(phenylsulfonyl)-diphenylmethane were prepared in the same manner as the Synthesis Example 1, except for using 55.2 g (0.3 mol) of benzophenone instead of 25.5 g (0.3 mol) of methylene chloride.

The results of analysis of the bis(phenylsulfonyl) diphenylmethane were as follows.
(1) Elemental analysis

|  | Found (wt %) | Calculated (wt %) |
|---|---|---|
| Carbon | 67.0 | 67.0 |
| Hydrogen | 4.6 | 4.5 |
| Sulfur | 14.2 | 14.3 |
| Oxygen | 14.1 | 14.3 |

(2) Melting point: 218° C. (decomposed)
(3) ([M+H]$^+$): 449
(4) $^1$H-NMR (CDCl$_3$, δ)

7.21 ppm (multiplet by 20H of phenyl group)

As described above in detail, selection of the specific disulfonylmethane derivative having excellent sensitivity and high solubility in solvents as a photoacid generator allows the positive-tone or negative-tone radiation sensitive resin composition of the present invention to be easily prepared into a resist, to exhibit superior storage stability, high sensitivity, and high resolution capability, and to produce excellent resist patterns. The radiation sensitive resin composition can be used with various types of radiation such as deep ultraviolet rays, X-rays, and charged particle rays. The composition is extremely useful as a resist for manufacturing semiconductor devices of which the size is progressively miniaturized in the future.

Obviously, numerous modifications and variations of the present invention are possible in light of the above teachings. It is therefore to be understood that, within the scope of the appended claims, the invention may be practiced otherwise than as specifically described herein.

What is claimed is:

1. A positive-tone radiation sensitive resin composition, comprising:

(a) a disulfonylmethane compound of the formula (1):

(1)

wherein R$^1$ and R$^2$ are the same or different and each represents a mono-valent acyclic hydrocarbon group, cycloalkyl group, aryl group, aralkyl group, or a mono-valent organic group having a heteroatom, or these groups which are optionally substituted; and X and Y are the same or different and each represents an aryl group, hydrogen atom, mono-valent acyclic hydrocarbon group, or a mono-valent organic group having a heteroatom, or such groups which are optionally substituted; provided that at least one of X and Y is an aryl group, X and Y in combination form a mono-cyclic or poly-cyclic structure containing one unsaturated bond, or X and Y in combination form the group represented by the formula (2),

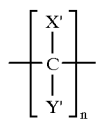
(2)

wherein X' and Y' are the same or different and each represents a hydrogen atom, halogen atom, alkyl group having 1–10 carbon atoms, cycloalkyl group having 3–10 carbon atoms, aryl group having 6–20 carbon atoms, or aralkyl group having 7–20 carbon atoms, or X' and Y' bonded to the same carbon atom or different carbon atoms in combination form a cyclic structure with 3–10 carbon atoms, and n is an integer from 2–10; and (B)(a) a resin protected by an acid decomposable group and insoluble or scarcely soluble in alkali, the resin becoming alkali soluble when the acid decomposable group is decomposed or, (b) an alkali-soluble resin and an alkali-solubility control agent.

2. The positive-tone radiation sensitive resin composition according to claim 1, wherein the disulfonylmethane compound is at least one compound selected from the group consisting of bis(phenylsulfonyl)-3-cyclopentene, bis (phenylsulfonyl)-2,4-cyclopentadiene, bis(phenylsulfonyl)-2,4-cyclohexadiene, 1-phenyl-1,1-bis(phenylsulfonyl) ethane, bis(phenylsulfonyl)-1-naphthylmethanol, bis (phenylsulfonyl)-1-naphthylmethanol, bis(phenylsulfonyl)-diphenylmethane, bis(cyclohexylsufonyl)fluorene, 1-(1-naphthyl)-1,1-bis(cyclohexylsulfonyl)ethane, bis (cyclohexylsulfonyl)-4-nitrophenylmethanol, bis(4-trifluoromethylphenylsulfonyl)-2,4-cyclohexadiene, 1-phenyl-(1,1-bis(4-trifluoromethyl-phenylsulfonyl)) ethane, bis(cyclohexylsulfonyl)-dipbenylmethane, bisphenylsulfonyl-cyclobutane, bisphenylmethane, bisphenylsulfonyl-cyclobutane, bisphenylsulfonyl-cyclopentane, bisphenylsulfonyl-cyclohexane, 1,1-bis (phenylsulfonyl)cyclobutane, 1,1-bis(phenylsulfonyl) cyclopentane, 1,1-bis(phenylsulfonyl)cyclohexane, 1,1-bis (phenylsulfonyl)cycloheptane, 1,1-bis(4-methylphenylsulfonyl)cyclobutane, 1,1-bis(4-methylphenylsulfonyl)cyclopentane, 1,1-bis(4-methylphenylsulfonyl)cyclohexane, and 1,1-bis(4-methylphenylsulfonyl)cycloheptane.

3. The positive-tone radiation sensitive resin composition according to claim 1, wherein the acid decomposable group in the resin (B) (a) is at least one group selected from the group consisting of t-butyl, benzyl, 1-methoxyethyl, 1-ethoxyethyl, trimethylsilyl t-butoxycarbonyl, t-butoxycarbonyl methyl, tetrahydropyranyl, tetrahydrofuranyl, tetrahydrothiopyranyl, and tetrahydrothiofuranyl.

4. The positive-tone radiation sensitive resin composition according to claim 1, wherein the acid decomposable group-containing resin (B)(a) is a resin with a part of the hydrogen atoms in the hydroxyl groups of poly(hydroxystyrene) being replaced by one or more acid decomposable groups of claim 3 or a resin with a part or all of the hydrogen atoms in the hydroxyl groups or carboxyl groups or both in the copolymer of hydroxystyrene and/or hydroxy-α-methyl styrene and (meth)acrylic acid being replaced by one or more acid decomposable groups of claim 3.

5. The positive-tone radiation sensitive resin composition according to claim 1, wherein the acid decomposable group-containing resin (B)(a) is poly(hydroxystyrene) resin in which 26 mol % of hydrogen atoms on a phenolic hydroxyl group is replaced by a t-butoxy carbonyl group, said resin having a molecular weight of 9,000, poly(hydroxystyrene) resin in which 20 mol % of hydrogen atoms on a phenolic hydroxyl group is replaced by a t-butoxy carbonyl methyl group, said resin having a molecular weight of 25,000, poly(hydroxystyrene) resin in which 32 mol % of hydrogen atoms on a phenolic hydroxyl group is replaced by a 1-ethoxyethyl group, said resin having a molecular or a copolymer of hydroxy-α-methyl styrene and t-butyl acrylate (copolymerization molar ratio=5:5, Mw=12,000).

6. The positive-tone radiation sensitive resin composition according to claim 1, wherein the alkali-soluble resin is an addition polymerization having at least one repeating unit represented by the following formulae (85) to (87),

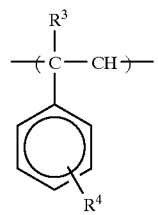
(85)

wherein $R^1$ is a hydrogen atom or a methyl group and $R^4$ is —OH, —COOH, —$R^5$COOH, —O$R^5$COOH, or —OCO$R^5$COOH, provided that $R^5$ represents a group —(CH)g—, wherein g is an integer from 1–4):

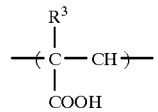
(86)

wherein $R^3$ is a hydrogen atom or a methyl group; or

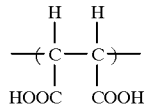
(87)

7. The positive-tone radiation sensitive resin composition according to claim 1, wherein the alkali-soluble resin is a polycondensation resin having at least one repeating unit represented by the formula (88)

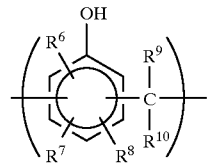
(88)

wherein $R^6$, $R^7$, $R^8$, $R^9$ and $R^{10}$ are the same or different and each represents a hydrogen atom or an alkyl group having 1 to 4 carbon atoms.

8. The positive-tone radiation sensitive resin composition according to claim 1, wherein the alkali solubility control agent is a compound having one of the following formulae (89) to (95):

(89)

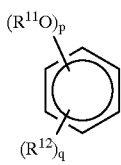

wherein $R^{11}$ indicates an acid decomposable group which is a 1-substituted methyl group, 1-substituted ethyl group, 1-branched alkyl group, silyl group, germyl group, alkoxy carbonyl group, acyl group, or cyclic acid decomposable group, with a plurality of $R^{11}$s being either the same or different, $R^{12}$ represents an alkyl group having 1–4 carbon atoms, phenyl group, or 1-naphthyl group, with a plurality of $R^{12}$s being either the same or different, p is an integer of 1 or more, q is an integer of 0 or more, provided that $p+q \leq 6$;

(90)

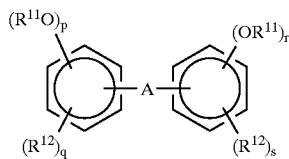

wherein $R^{11}$ and $R^{12}$ are the same as those defined for formula (89) and A represents a single bond of —S—, —O—, —C, —COO—, —SO—, —SO$_2$—, or —C($R^{13}$)($R^{14}$)—, wherein $R^{13}$ and $R^{14}$, which may be either the same or different, represent a hydrogen atom, alkyl group having 1–6 carbon atoms, acyl group having 2–11 carbon atoms, phenyl group, or naphthyl group, or a group:

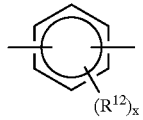

wherein $R^{12}$ is the same as defined above and X is an integer from 0 to 4), p, q, r, and s are, respectively, an integer of 0 or more, provided that $p+q \leq 5$, $r+s \leq 5$, and $p+r \geq 1$;

(91)

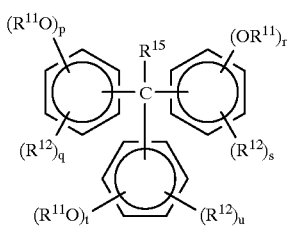

wherein $R^{11}$ and $R^{12}$ are the same as defined for the formula (89), $R^{15}$ is a hydrogen atom, an alkyl group having 1–4 carbon atoms, or a phenyl group and p, q, r, s, t, and u are, respectively, an integer of 0 or more, provided that $p+q \leq 5$, $r+s \leq 5$, $t+u \leq 5$, and $p+r+t \geq 1$;

(92)

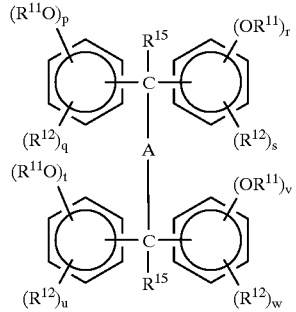

wherein $R^{11}$ and $R^{12}$ are the same as defined for the formula (89), A is the same as defined for formula (90), and $R^{15}$ is the same as defined for the formula (91), with a plurality of $R^{15}$s being either the same or different, and p, q, r, s, t, u, v, and w are, respectively, an integer of 0 or more, provided that $p+q \leq 5$, $r+s \leq 5$, $t+u \leq 5$, $v+w \leq 5$, and $p+r+v \geq 1$;

(93)

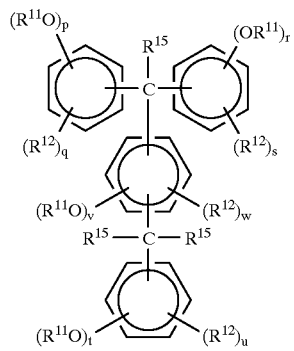

wherein $R^{11}$ and $R^{12}$ are the same as defined for the formula (89), $R^{15}$ is the same as defined for the formula (91), with a plurality or $R^{15}$s being either the same or different, and p, q, r, s, t, u, v, and w, respectively, an integer of 0 or more, provided that $p+q \leq 5$, $r+s \leq 5$, $t+u \leq 5$, $v+w \leq 4$, and $p+r+t+v \geq 1$;

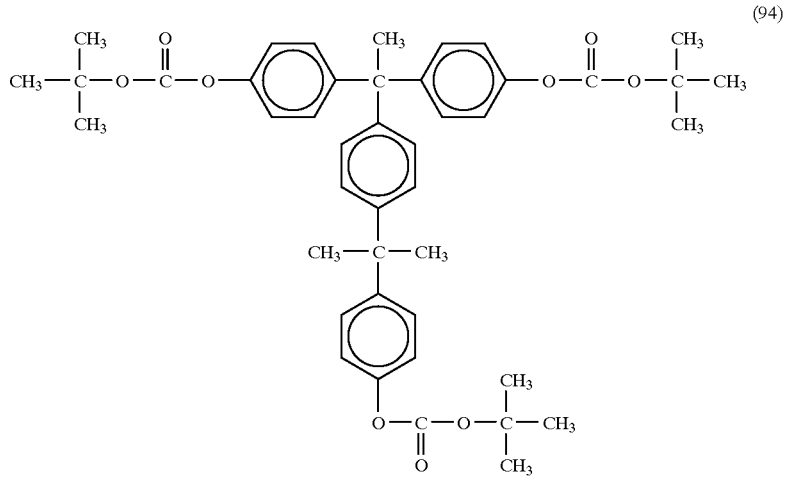

(94)

and

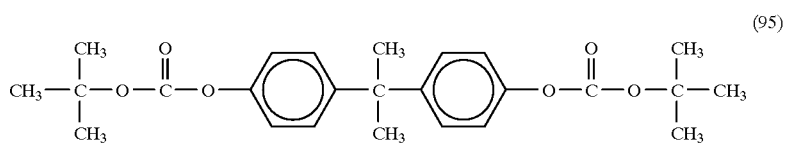

(95)

9. The positive-tone radiation sensitive resin composition according to claim 1, comprising 0.001–70 parts by weight of disulfonylmethane derivative (A) and 100 parts by weight of acid decomposable group-containing resin.

10. The positive-tone radiation sensitive resin composition according to claim 1, comprising 0.001–70 parts by weight of disulfonylmethane derivative (A), 100 parts by weight of alkali-soluble resin, and 5–150 parts by weight of alkali solubility control agent.

11. The positive-tone radiation sensitive resin composition according to claim 1, further comprising an acid diffusion control agent.

12. The positive-tone radiation sensitive resin composition according to claim 11, wherein the acid diffusion control agent is a compound selected from the group consisting of tributylamine, tripentylamine, trihexylamine, triheptylamine, trioctylamine, N,N-dimethylaniline, benzimidazole, 4-phenylpyridine, 4,4-diaminodiphenylether, and nicotinic acid amide.

13. The positive-tone radiation sensitive resin composition of claim 1, wherein said mono-valent acyclic hydrocarbon group for each of $R^1$ and $R^2$ is $C_1$–$C_6$ alkadienyl, which are unsubstituted or substituted by halogen, amino, dialkylamino, acetoamino, acyl, acyloxo, alkylthio, arylthio, nitro, cyano, arylsulfonyl or hydroxyl.

14. The positive-tone radiation sensitive resin composition of claim 1, wherein said cycloalkyl group for each of $R^1$ and $R^2$ is $C_3$–$C_8$ cycloalkyl which is unsubstituted or substituted by alkyl, halogen, amino, dialkylamino, acetamino, acyl, acyloxo, alkylthio, arylthio, nitro, cyano, arylsulfonyl or hydroxyl.

15. The positive-tone radiation sensitive resin composition of claim 1, wherein said aryl group for each of $R^1$ and $R^2$ is phenyl, biphenylyl, 1-naphthyl, 1-anthryl, 9-anthoyl or 9-phenanthryl, each of which are unsubstituted or substituted by alkyl, perfluoroalkyl, halogen, alkoxy, acyl, acyloxy, aralkyl, nitro, cyano, hydroxy, vinyl, or acetoamino.

16. The positive-tone radiation sensitive resin composition of claim 1, wherein said aralkyl group for each of $R^1$ and $R^2$ is $C_7$–$C_{20}$ aralkyl which is unsubstituted or substituted by alkyl, perfluoroalkyl, halogen, alkoxy, acyl, acylox, aralkyl, nitro, cyano, hydroxy, vinyl or acetamino.

17. The positive-tone radiation sensitive resin composition of claim 1, wherein mono-valent organic group having a heteroatom is cyano, dimethylamino carbonyl, 4-bromobenzyl, 2-pyridinyl or 4-pyridinyl.

18. A negative-tone radiation sensitive resin composition, comprising:

(A) a disulfonylmethane compound of the formula (1):

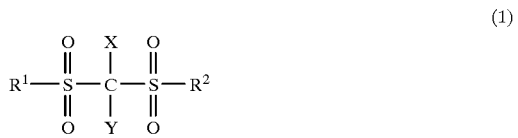

(1)

wherein $R^1$ and $R^2$ are the same or different and each represents a mono-valent acyclic hydrocarbon group, cycloalkyl group, aryl group, aralkyl group, or other mono-valent organic group having a heteroatom or these groups which are optionally substituted; and X and Y are the same or different and each represents an aryl group, hydrogen atom, mono-valent acyclic hydrocarbon group, or a mono-valent organic group having a heteroatom, or these groups which are optionally substituted provided that at least one of X and Y is an aryl group, X and Y in combination form a mono-cyclic or poly-cyclic structure containing one unsaturated bond, or X and Y in combination form the group represented by the following formula (2),

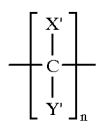
(2)

wherein X' and Y' are the same or different and each represents a hydrogen atom, halogen atom, alkyl group having 1–10 carbon atoms, cycloalkyl group having 3–10 carbon atoms, aryl group having 6–20 carbon atoms, or aralkyl group having 7–20 carbon atoms, or X' and Y' bonded to the same carbon atom or different carbon atoms in combination form a cyclic structure with 3–10 carbon atoms, and n is an integer from 2–10;

(C) an alkali-soluble resin; and (D) a compound capable of cross-linking the alkali-soluble resin in the presence of an acid.

19. The negative-tone radiation sensitive resin composition according to claim 18, wherein the disulfonylmethane compound is at least one compound selected from the group consisting of bis(phenylsulfonyl)-3-cyclopentene, bis (phenylsulfonyl)-2,4-cyclopentadiene, bis(phenylsulfonyl)-2,4-cyclohexadiene, 1-phenyl-1,1-bis(phenylsulfonyl) ethane, bis(phenylsulfonyl)-1-naphthylmethanol, bis (phenylsulfonyl)-diphenylmethane, bis(cyclohexylsulfonyl) fluorene, 1-(1-naphthyl)-1,1-bis(cyclohexylsulfonyl)ethane, bis(cyclohexylsulfonyl)-4-nitrophenylmethanol, bis(4-trifluoromethylphenylsulfonyl)-2,4-cyclohexadiene, 1-phenyl-[1,1-bis(trifluoromethylphenylsulfonyl)]ethane, bis(cyclohexylsulfonyl)-diphenylmethane, bisphenylsulfonyl-cyclobutane, bisphenylsulfonyl-cyclopentane, bisphenylsulfonyl-cyclohexane, 1,1-bis (phenylsulfonyl)cyclobutane, 1,1-bis(phenylsulfonyl) cyclopentane, 1,1-bis(phenylsulfonyl)cyclohexane, 1,1-bis (phenylsulfonyl)cycloheptane, 1,1-bis(4-methylphenylsulfonyl)cyclobutane, 1,1-bis(4-methylphenylsulfonyl)cyclopentane, 1,1-bis(4-methylphenylsulfonyl)cyclohexane, and 1,1-bis(4-methylphenyisulfonyl)cycloheptane.

20. The negative-tone radiation sensitive resin composition according to claim 18, wherein the alkali-soluble resin is an addition polymerization resin processing at least one repeating unit represented by the following formulas (85) to (87),

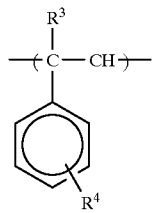
(85)

wherein $R^3$ is a hydrogen atom or a methyl group and $R^4$ is —OH, —COOH, —$R^5$COOH, —O$R^5$COOH, or —OCO$R^5$COOH, provided that $R^5$ represents a group —(CH)g—, wherein g is an integer from 1–4;

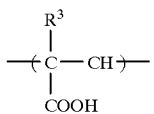
(86)

wherein $R^3$ is a hydrogen atom or a methyl group; or

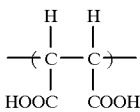
(87)

21. The negative-tone radiation sensitive resin composition according to claim 18, wherein the alkali-soluble resin is a polycondensation resin possessing at least one repeating unit represented by the following formula (88),

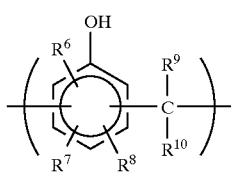
(88)

wherein $R^6$, $R^7$, $R^8$, $R^9$, and $R^{10}$ may be the same or different and each individually represents a hydrogen atom or an alkyl group having 1–4 carbon atoms.

22. The negative-tone radiation sensitive resin composition according to claim 18, wherein the compound capable of cross-linking the alkali-soluble resin in the presence of an acid is a compound having at least one substituent selected from the groups represented by the following formulas (96)–(100):

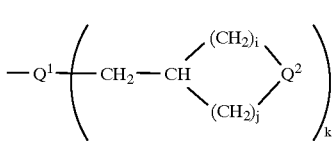
(96)

wherein k is 1 or 2; $Q^1$ represents, when k is 1, a single bond —O—, —S—, —COO—, or —NH—, and when k is 2, a trivalent N; $Q^2$ is —O— or —S—; i is 0 or an integer from 1 to 31 and j is an integer from 1 to 3, provided that i+j is 1 to 4;

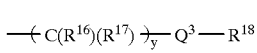
(97)

wherein $Q^3$ represents —O—, —COO—, or —CO—; $R^{16}$ and $R^{17}$, which may be the same or different, represent a hydrogen atom or an alkyl group having 1–4 carbon atoms; and $R^{14}$ represents an alkyl group having 1–5 carbon atoms, an aryl group having 6–12 carbon atoms, or an aralkyl group having 7 to 14 carbon atoms; and y is an integer of 1 or more;

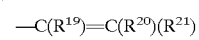
(98)

wherein $R^{19}$, $R^{20}$ and $R^{21}$, which may be the same or different, represent a hydrogen atom or an alkyl group having 1–4 carbon atoms;

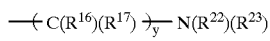
(99)

wherein $R^{16}$ and $R^{17}$ have the same meaning as defined in the formula (97); $R^{22}$ and $R^{23}$, which may the same or different, represent an alkylol having 1–5 carbon atoms; and y is 0 or an integer of 1 or more; or

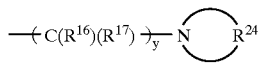
(100)

wherein $R^{16}$ and $R^{17}$ have the sane meanings as defined in the formula (97); $R^{24}$ is a divalent organic group which can form tri- or octa-cyclic structure containing a hetero atom selected from oxygen, sulfur, and nitrogen.

23. The negative-tone radiation sensitive resin composition according to claim 18, wherein the compound capable of cross-linking the alkali-soluble resin in the presence of an acid is dimethoxymethylurea or tetramethoxymethyl glycoloyl.

24. The negative-tone radiation sensitive resin composition according to claim 18, comprising 0.001–70 parts by weight of disulfonylmethane derivative (A), 100 parts by weight of alkali-soluble resin (C), and 5–95 parts by weight of the compound capable of cross-linking the alkali-soluble resin in the presence of an acid (D).

25. The negative-tone radiation sensitive resin composition according to claim 18, further comprising an acid diffusion control agent.

26. The negative-tone radiation sensitive resin composition of claim 18, wherein said mono-valent acyclic hydrocarbon group for each of $R^1$ and $R^2$ is $C_1$–$C_6$ alkadienyl, which are unsubstituted or substituted by halogen, amino, dialkylamino, acetoamino, acyl, acyloxo, alkylthio, arylthio, nitro, cyano, arylsulfonyl or hydroxyl.

27. The negative-tone radiation sensitive resin composition of claim 18, wherein said cycloalkyl group for each of $R^1$ and $R^2$ is $C_3$–$C_8$ cycloalkyl which is unsubstituted or substituted by alkyl, halogen, amino, dialkylamino, acetoamino, acyl, acyloxo, alkylthio, arylthio, nitro, cyano, arylsulfonyl or hydroxyl.

28. The negative-tone radiation sensitive resin composition of claim 18, wherein said aryl group for each of $R^1$ and $R^2$ is phenyl, biphenylyl, 1-naphthyl, 1-anthryl, 9-anthoyl or 9-phenanthryl, each of which are unsubstituted or substituted by alkyl, perfluoroalkyl, halogen, alkoxy, acyl, acyloxy, aralkyl, nitro, cyano, hydroxy, vinyl, or acetoamino.

29. The negative-tone radiation sensitive resin composition of claim 18, wherein said aralkyl group for each of $R^1$ and $R^2$ is $C_7$–$C_{20}$ aralkyl which is unsubstituted or substituted by alkyl, perfluoroalkyl, halogen, alkoxy, acyl, acyloxy, aralkyl, nitro, cyano, hydroxy, vinyl or acetoamino.

30. The negative-tone radiation sensitive resin composition of claim 18, wherein mono-valent organic group having a heteroatom is cyano, dimethylamino carbonyl, 4-bromobenzyl, 2-pyridinyl or 4-pyridinyl.

* * * * *